(12) United States Patent
Beristany et al.

(10) Patent No.: US 12,300,989 B2
(45) Date of Patent: May 13, 2025

(54) UNIVERSAL MOUNT COVER PLATE FOR ELECTRICAL BOXES

(71) Applicant: HUBBELL INCORPORATED, Shelton, CT (US)

(72) Inventors: Victor Beristany, South Bend, IN (US); Krzysztof Wojciech Korcz, Granger, IN (US); Krishna C. Patel, Granger, IN (US)

(73) Assignee: HUBBELL INCORPORATED, Shelton, CT (US)

( * ) Notice: Subject to any disclaimer, the term of this patent is extended or adjusted under 35 U.S.C. 154(b) by 159 days.

(21) Appl. No.: 18/168,999

(22) Filed: Feb. 14, 2023

(65) Prior Publication Data

US 2023/0261454 A1    Aug. 17, 2023

Related U.S. Application Data

(60) Provisional application No. 63/344,825, filed on May 23, 2022, provisional application No. 63/344,827, filed on May 23, 2022, provisional application No. 63/344,821, filed on May 23, 2022, provisional application No. 63/311,328, filed on Feb. 17, 2022.

(51) Int. Cl.
*H02G 3/14* (2006.01)
*H02G 3/08* (2006.01)
*H02G 3/12* (2006.01)
*H05K 5/02* (2006.01)

(52) U.S. Cl.
CPC ............... *H02G 3/14* (2013.01); *H02G 3/081* (2013.01); *H02G 3/12* (2013.01); *H02G 3/126* (2013.01); *H05K 5/0204* (2013.01)

(58) Field of Classification Search
None
See application file for complete search history.

(56) References Cited

U.S. PATENT DOCUMENTS

| 982,841 | A | * | 1/1911 | Maison | H02G 3/125 220/3.9 |
|---|---|---|---|---|---|
| 1,288,024 | A | * | 12/1918 | Kendig | H02G 3/125 220/3.9 |
| 1,828,064 | A | * | 10/1931 | Paine | H02G 3/125 220/3.9 |
| 3,588,017 | A | * | 6/1971 | O'Brien | H02G 3/125 220/3.9 |
| 4,135,337 | A | * | 1/1979 | Medlin | H02G 3/125 248/228.7 |
| 5,448,011 | A | * | 9/1995 | Laughlin | H02G 3/126 174/480 |

(Continued)

FOREIGN PATENT DOCUMENTS

WO    2021/011764 A1    1/2021

OTHER PUBLICATIONS

Eaton "B-Line Series: BB5-HF hands-free box bracket" Eaton Publication No. SA306029EN; Jan. 2019.

(Continued)

*Primary Examiner* — Krystal Robinson
(74) *Attorney, Agent, or Firm* — Ruggiero McAllister & McMahon LLC

(57) ABSTRACT

A cover plate that is connectable to an electrical box includes a body configured to mount to a stud, a brace assembly, or in a gang application on opposite sides of the stud.

15 Claims, 16 Drawing Sheets

(56) References Cited

U.S. PATENT DOCUMENTS

| | | | | |
|---|---|---|---|---|
| 5,744,753 | A | * | 4/1998 | Nattel .................... H02G 3/081 |
| | | | | 220/3.3 |
| 5,810,303 | A | | 9/1998 | Bourassa et al. |
| 5,931,325 | A | * | 8/1999 | Filipov .................. H02G 3/081 |
| | | | | 220/3.7 |
| 6,335,486 | B1 | * | 1/2002 | Reiker .................... E04B 9/006 |
| | | | | 174/51 |
| 2005/0176278 | A1 | | 8/2005 | Cheatham et al. |
| 2007/0187402 | A1 | * | 8/2007 | Dinh ...................... H02G 3/126 |
| | | | | 220/3.9 |
| 2007/0194180 | A1 | * | 8/2007 | Korcz .................... H02G 3/123 |
| | | | | 248/56 |
| 2008/0236859 | A1 | * | 10/2008 | de la Borbolla ......... H02G 3/14 |
| | | | | 174/66 |
| 2010/0108347 | A1 | | 5/2010 | Korcz et al. |
| 2012/0031640 | A1 | * | 2/2012 | Korcz .................... H02G 3/086 |
| | | | | 174/66 |
| 2014/0262417 | A1 | | 9/2014 | Korcz et al. |
| 2015/0333493 | A1 | | 11/2015 | Jones |
| 2016/0099555 | A1 | | 4/2016 | Nikayin et al. |
| 2017/0093141 | A1 | * | 3/2017 | Jones ....................... H02G 1/00 |
| 2017/0256928 | A1 | | 9/2017 | Korcz et al. |
| 2018/0048134 | A1 | * | 2/2018 | Korcz .................... H02G 3/125 |
| 2019/0376643 | A1 | * | 12/2019 | Witherbee ................ H02G 3/10 |
| 2020/0194983 | A1 | | 6/2020 | Korcz et al. |
| 2020/0378553 | A1 | * | 12/2020 | Oh .......................... H02G 3/08 |
| 2021/0006055 | A1 | | 1/2021 | Korcz et al. |
| 2021/0041059 | A1 | | 2/2021 | Witherbee et al. |
| 2022/0030731 | A1 | | 1/2022 | Oh et al. |

OTHER PUBLICATIONS

Orbit Industries "Preassembled SSB With UMA and 4S Deep Box With 10" Ground Pigtail", Dec. 2021.

NVent Caddy "Box Mounting Plate with Far Side Support-TB45PK", 2022.

* cited by examiner

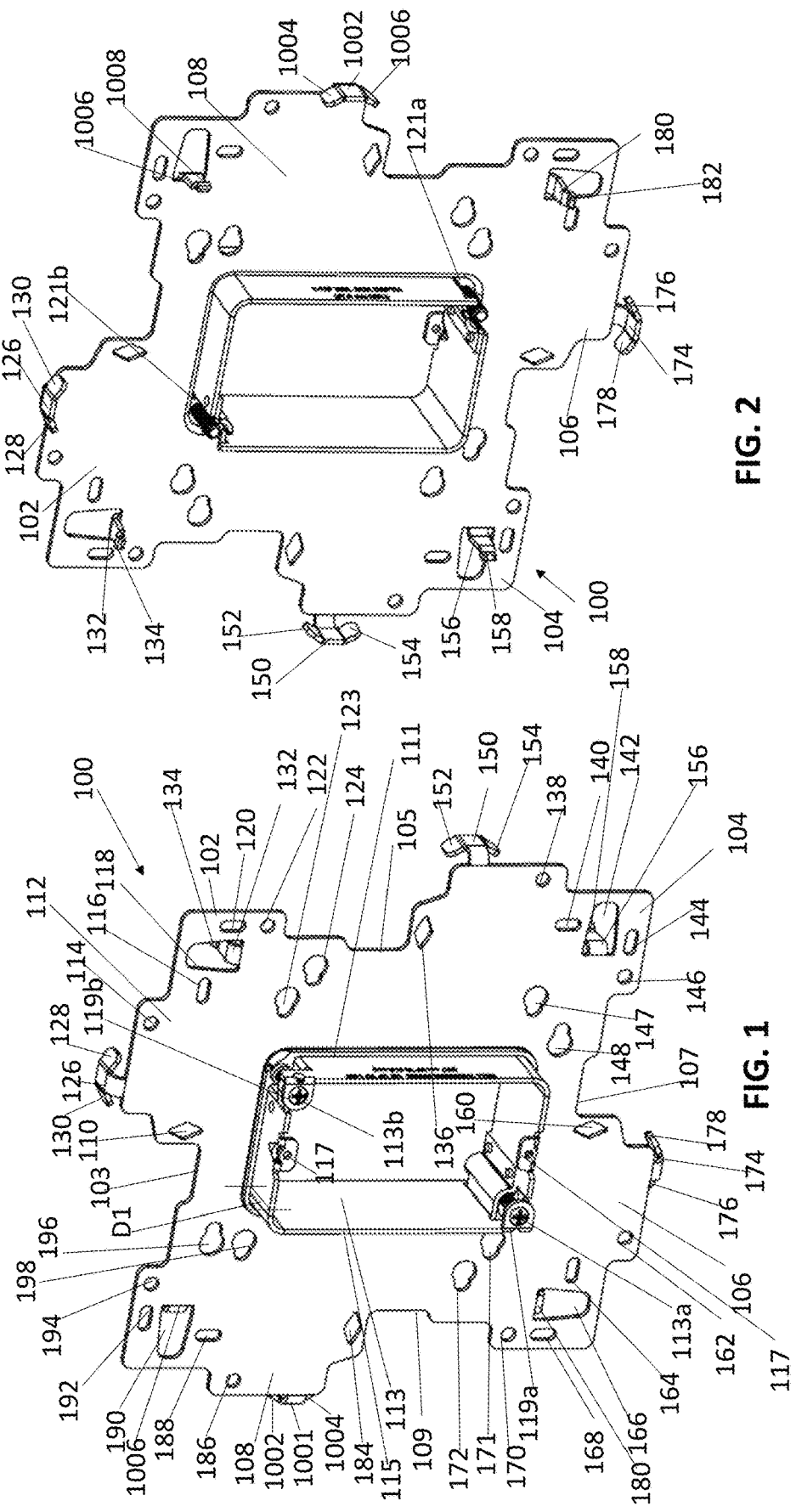

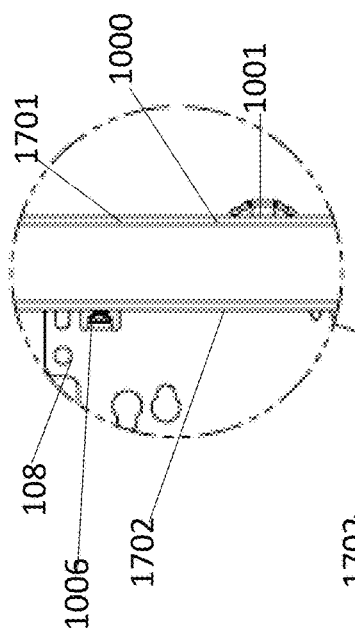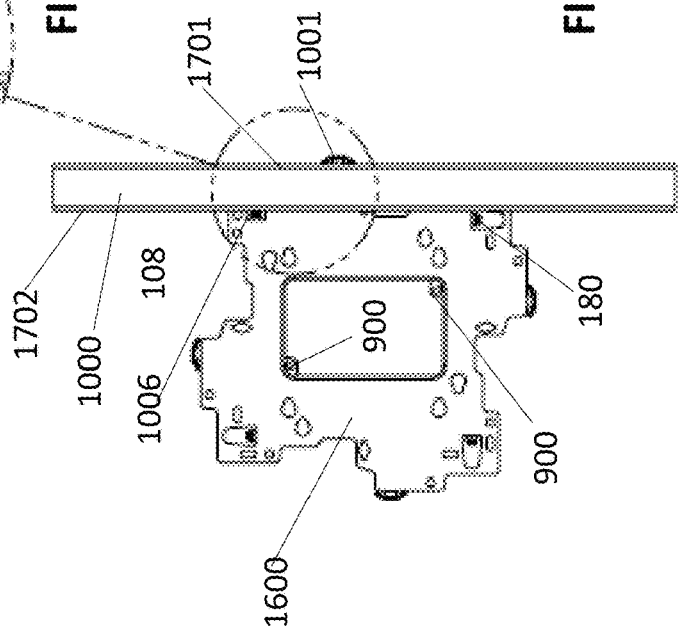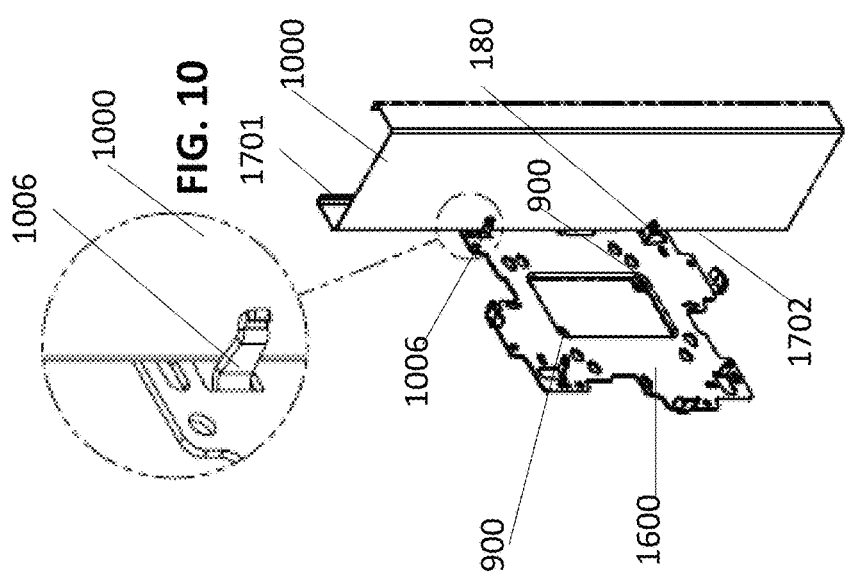

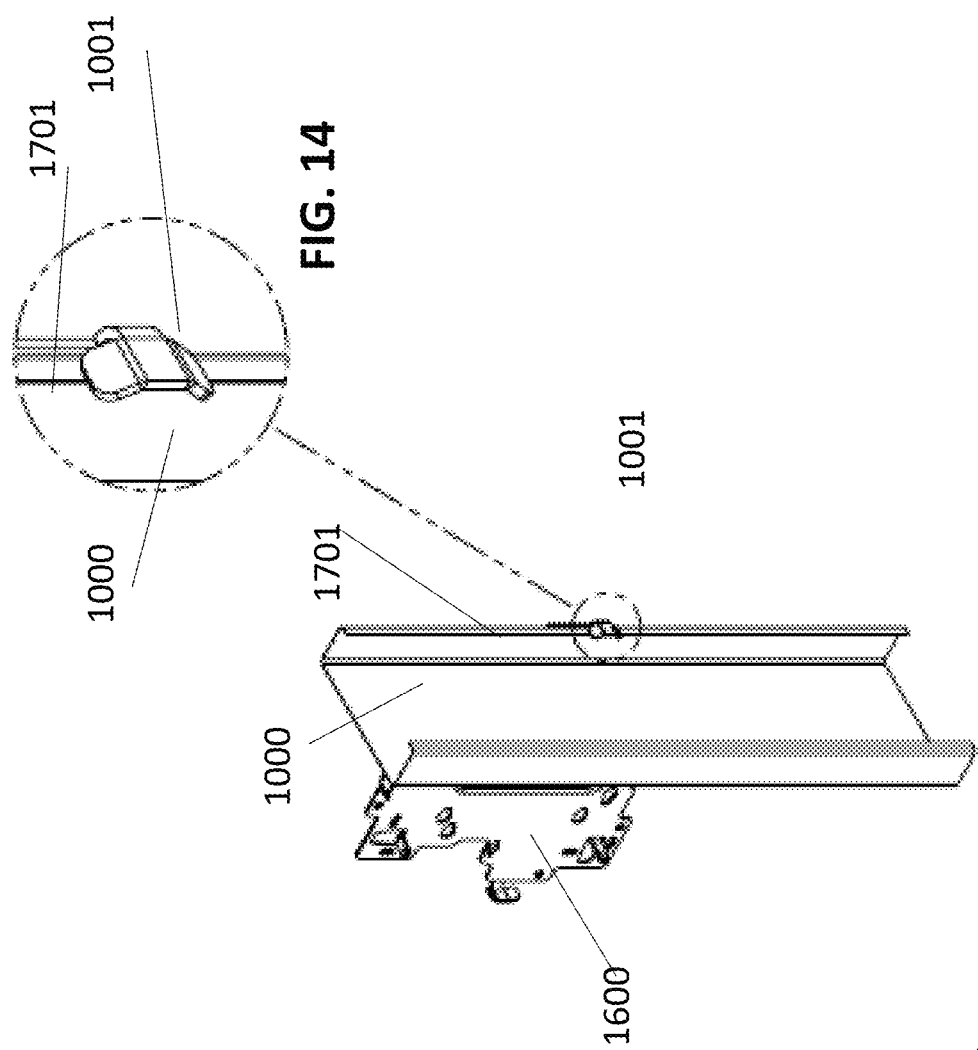

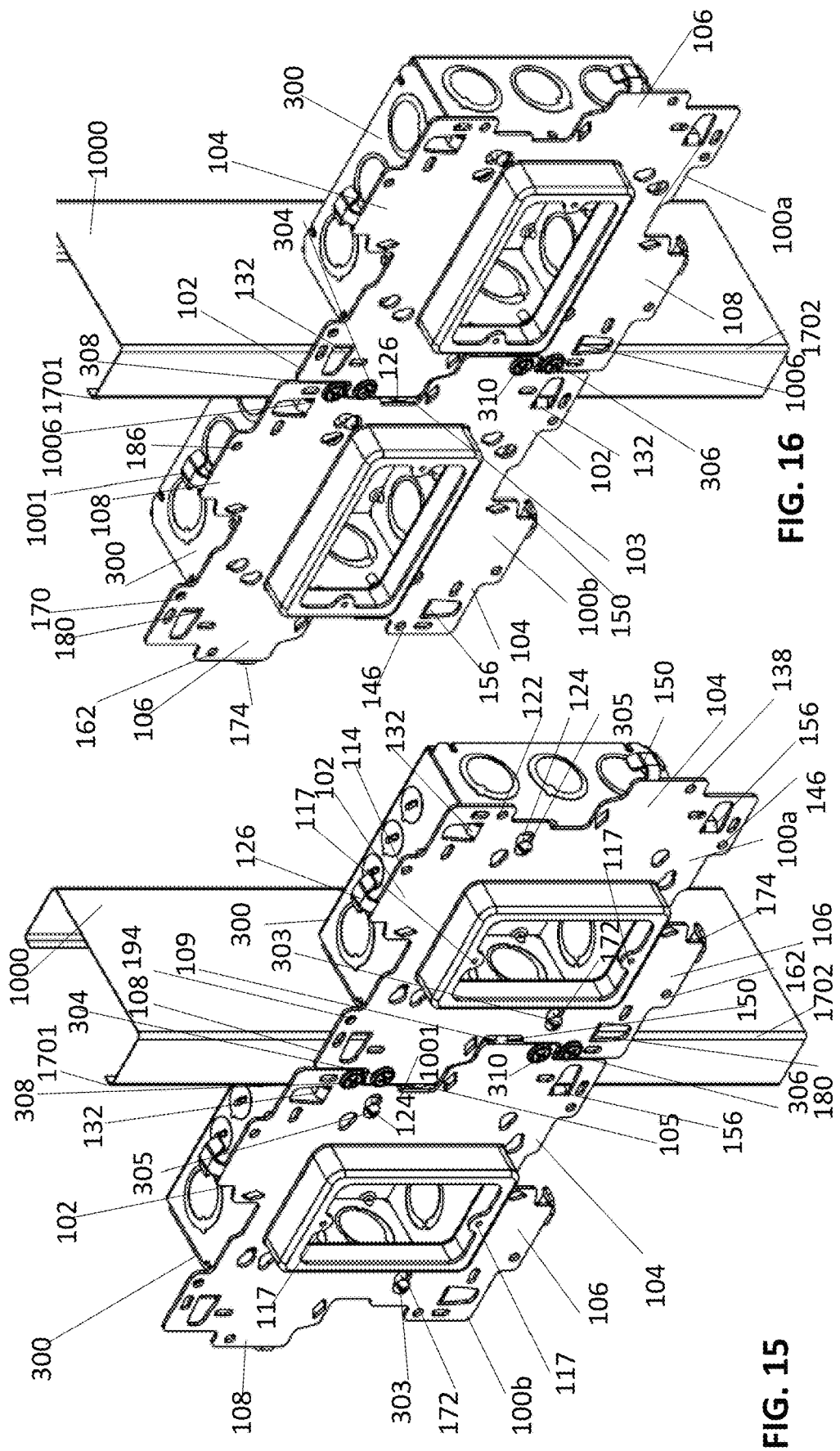

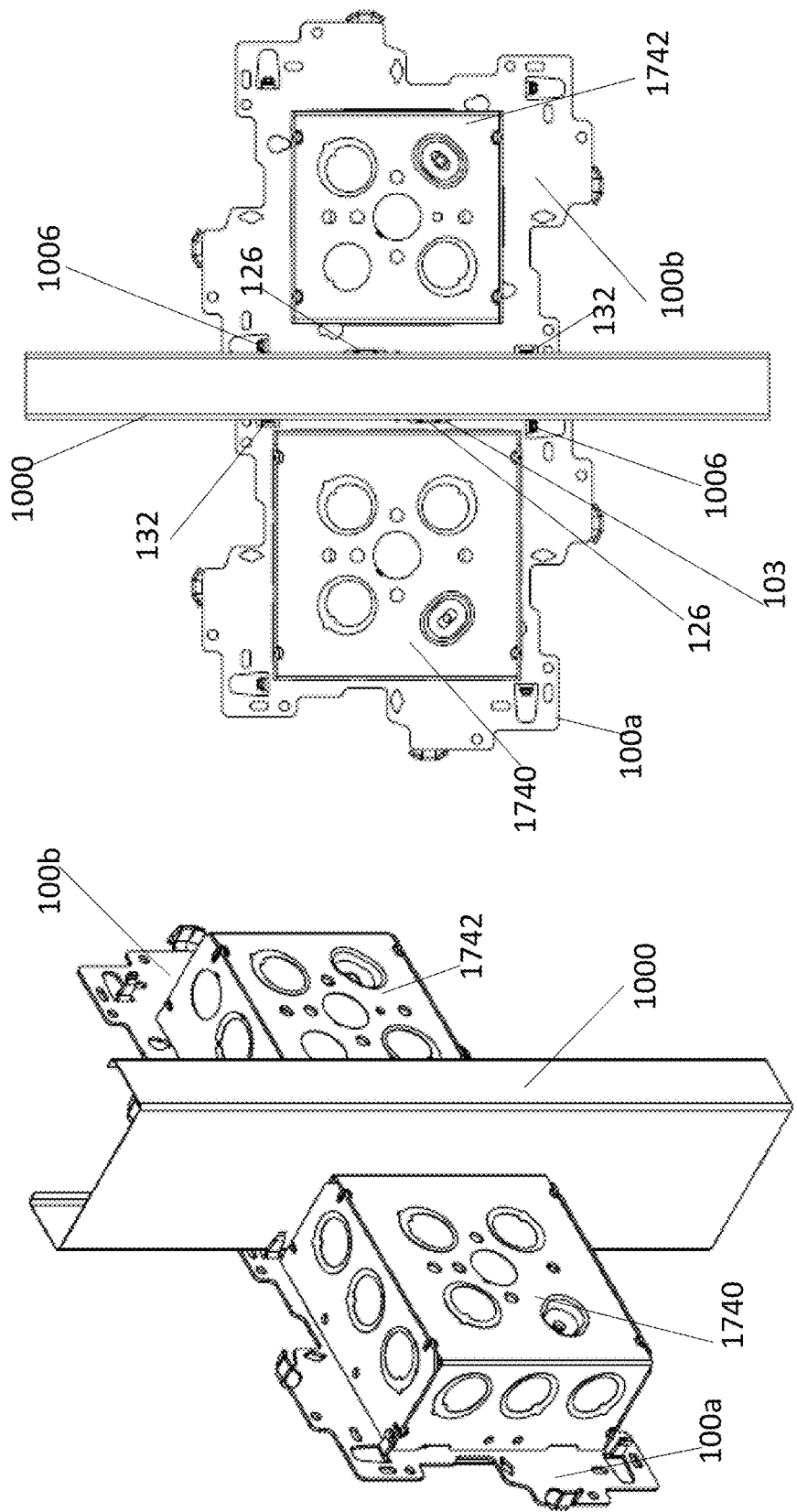

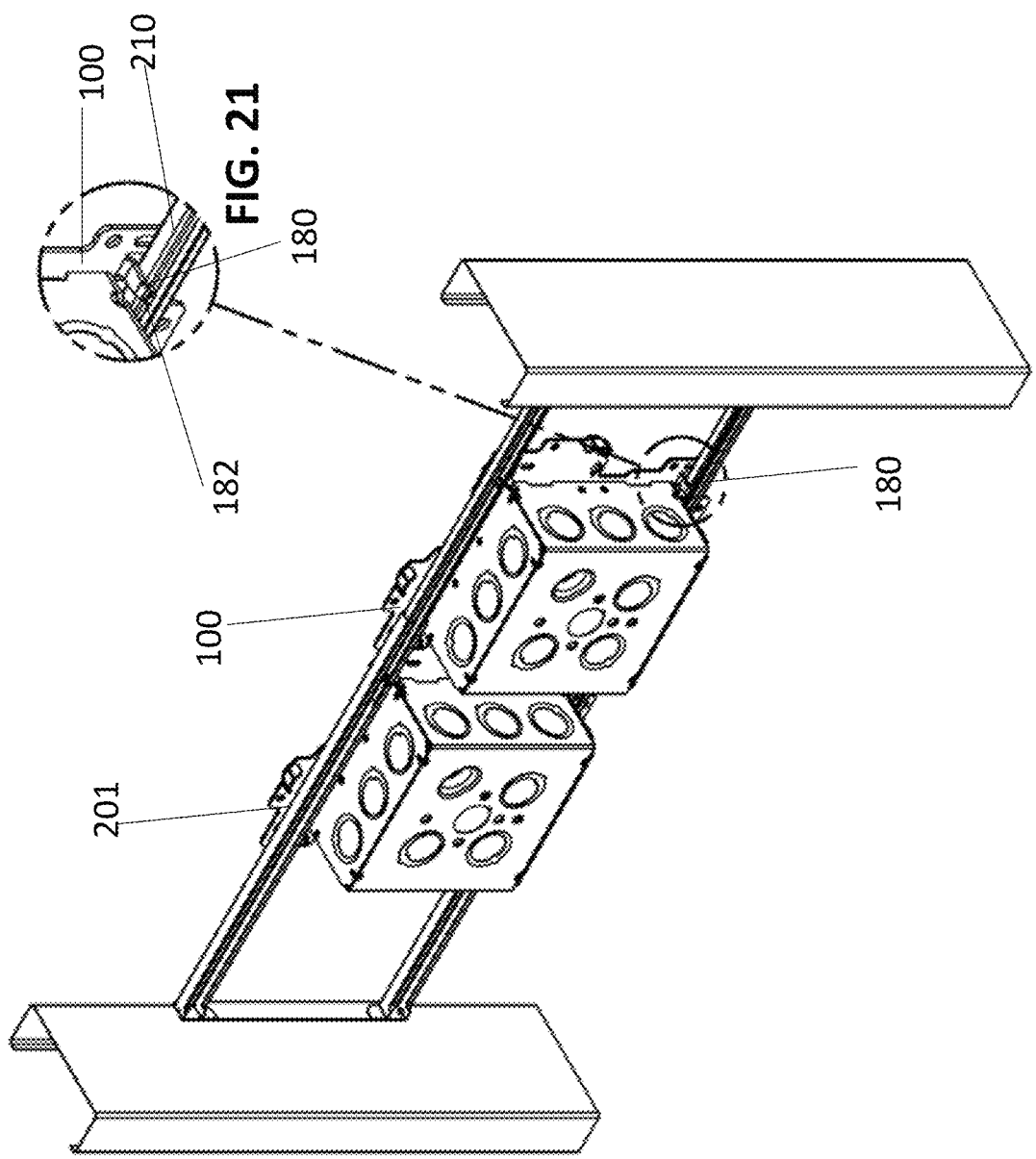

UNIVERSAL MOUNT COVER PLATE FOR ELECTRICAL BOXES

CROSS REFERENCE TO RELATED APPLICATIONS

This application claims the benefit of U.S. Application 63/311,328, filed Feb. 17, 2022, the contents of which are incorporated by reference herein. This application claims the benefit of U.S. Application 63/344,821, filed May 23, 2022, the contents of which are incorporated by reference herein. This application claims the benefit of U.S. Application 63/344,825, filed May 23, 2022, the contents of which are incorporated by reference herein. This application claims the benefit of U.S. Application 63/344,827, filed May 23, 2022, the contents of which are incorporated by reference herein.

BACKGROUND

1. Field of the Invention

The present disclosure is related to a cover plate for electrical boxes. In particular, the present disclosure is related to a mount cover plate for electrical boxes that has a universal mounting for either a stud or a brace and can be used for gangable applications.

2. Description of Related Art

The traditional mounting process of a cover plate is to attach the cover plate to an electrical box, which also called an outlet box, place the assembly of the cover plate and electrical box over the stud, align the assembly of the cover plate and electrical box, and screw attach the assembly of the cover plate and electrical box while holding it. If a single gang cover plate is required, a user will undesirably need either a separate horizontal plate or a separate vertical plate depending on the application. A regular cover plate undesirably cannot be mounted on each side of the stud. A different depth for the cover plate is also needed depending on the wall thickness. Even further, these stud mount cover plates will not usually work with pre-fab installations.

Accordingly, it has been determined by the present disclosure that there is a continuing need for a device that overcomes, alleviates, and/or mitigates one or more of the aforementioned and other deleterious effects of prior devices.

SUMMARY

A cover plate that is connectable to an electrical box is provided that includes a body configured to mount to a stud, a brace assembly, or in a gang application on opposite sides of the stud.

A method of attaching a cover plate to a stud is also provided that includes positioning a stud tab extending from a body on a first side of the stud; and moving the body to position a projection extending from the body on a second side of a stud so that the body snaps on over the stud allowing for insertion of one or more fasteners.

A method of attaching a cover plate to a brace is also provided that includes positioning a plurality of projections extending from a body between two rails of the brace so that the body snaps on the brace allowing for insertion of one or more fasteners.

In some embodiments either alone or together with any one or more of the aforementioned and/or after-mentioned embodiments, the body snaps on over the stud allowing for insertion of one or more fasteners.

In some embodiments either alone or together with any one or more of the aforementioned and/or after-mentioned embodiments, the body snaps on the brace allowing for insertion of one or more fasteners.

In some embodiments either alone or together with any one or more of the aforementioned and/or after-mentioned embodiments, the body is selectively slidable on the brace.

In some embodiments either alone or together with any one or more of the aforementioned and/or after-mentioned embodiments, the body is symmetrical on four sides.

In some embodiments either alone or together with any one or more of the aforementioned and/or after-mentioned embodiments, the body is connectable to the stud or the brace in a horizontal orientation or a vertical orientation.

In some embodiments either alone or together with any one or more of the aforementioned and/or after-mentioned embodiments, the body forms a first flap, a second flap, a third flap and a fourth flap.

In some embodiments either alone or together with any one or more of the aforementioned and/or after-mentioned embodiments, each of the first flap, the second flap, the third flap and the fourth flap has a stud tab and a projection.

In some embodiments either alone or together with any one or more of the aforementioned and/or after-mentioned embodiments, the stud tab and the projection of one of the first flap, the second flap, the third flap and the fourth flap extend on opposite sides of the stud to connect the cover plate to the stud, and the stud tab of the one of the first flap, the second flap, the third flap and the fourth flap extends on a first side of the stud and the projection of the one of the first flap, the second flap, the third flap and the fourth flap extends on a second side of the stud that is opposite the first side of the stud.

In some embodiments either alone or together with any one or more of the aforementioned and/or after-mentioned embodiments, the projection of another of one of the first flap, the second flap, the third flap and the fourth flap extends on the second side of the stud.

In some embodiments either alone or together with any one or more of the aforementioned and/or after-mentioned embodiments, each of the first flap, the second flap, the third flap and the fourth flap has an opening to receive a fastener to connect the cover plate to the stud and an opening to connect the cover plate to the brace.

In some embodiments either alone or together with any one or more of the aforementioned and/or after-mentioned embodiments, each of the first flap, the second flap, the third flap and the fourth flap has two openings to receive fasteners to connect the cover plate to the stud and two openings to connect the cover plate to the brace.

In some embodiments either alone or together with any one or more of the aforementioned and/or after-mentioned embodiments, the first flap, the second flap, the third flap and the fourth flap allow the body to be connected on the stud in four different orientations on a first side of the stud and four different orientations on a second side of the stud that is opposite the first side of the stud.

In some embodiments either alone or together with any one or more of the aforementioned and/or after-mentioned embodiments, the first flap, the second flap, the third flap and the fourth flap allow the body to be connected on the brace in four different orientations.

In some embodiments either alone or together with any one or more of the aforementioned and/or after-mentioned embodiments, the cover plate is a first cover plate and further comprising a second cover plate, and the body of the first cover plate has a cutout to receive the stud tab of the second cover plate therein and the body of the second cover plate has a cutout to receive the stud tab of the first cover plate therein.

In some embodiments either alone or together with any one or more of the aforementioned and/or after-mentioned embodiments, the body has an opening that receives a sleeve that is adjustable in the opening.

In some embodiments either alone or together with any one or more of the aforementioned and/or after-mentioned embodiments, the electrical box is a plurality of electrical boxes each having a different size, and the body is connectable to each of the plurality of electrical boxes.

In some embodiments either alone or together with any one or more of the aforementioned and/or after-mentioned embodiments, the body has a plurality of fastener holes and/or grooves through the body to connect to electrical boxes of various sizes.

The above-described and other features and advantages of the present disclosure will be appreciated and understood by those skilled in the art from the following detailed description, drawings, and appended claims.

DESCRIPTION OF THE DRAWINGS

FIG. 1 is a front perspective view of a single gang cover plate according to the present disclosure.
FIG. 2 is a rear perspective view of FIG. 1.
FIG. 9 is a right side perspective view of the single gang cover plate of FIG. 5 modified to replace the flange with connector holes and connected to a stud.
FIG. 10 is an enlarged partial perspective view of FIG. 9.
FIG. 11 is a rear perspective view of FIG. 9.
FIG. 12 is an enlarged partial perspective view of FIG. 11.
FIG. 13 is a left side perspective view of FIG. 9.
FIG. 14 is an enlarged partial perspective view of FIG. 13.
FIG. 15 is a front perspective view of a first single gang cover plate that is the same as the single gang cover plate of FIG. 5 connected to a first electrical box and a second single gang cover plate that is the same as the single gang cover plate of FIG. 5 connected to another first electrical box both connected to the stud in a vertical mounting configuration.
FIG. 16 is a front perspective view of a first single gang cover plate that is the same as the single gang cover plate of FIG. 5 connected to the first electrical box and a second single gang cover plate that is the same as the single gang cover plate of FIG. 5 connected to another first electrical box both connected to the stud in a horizontal mounting configuration.
FIG. 17 is a rear perspective view of FIG. 16.
FIG. 18 is a rear view of FIG. 16.
FIG. 20 is a rear perspective view of FIG. 19.
FIG. 21 is an enlarged partial perspective view of FIG. 20.

DETAILED DESCRIPTION

Figure 3:
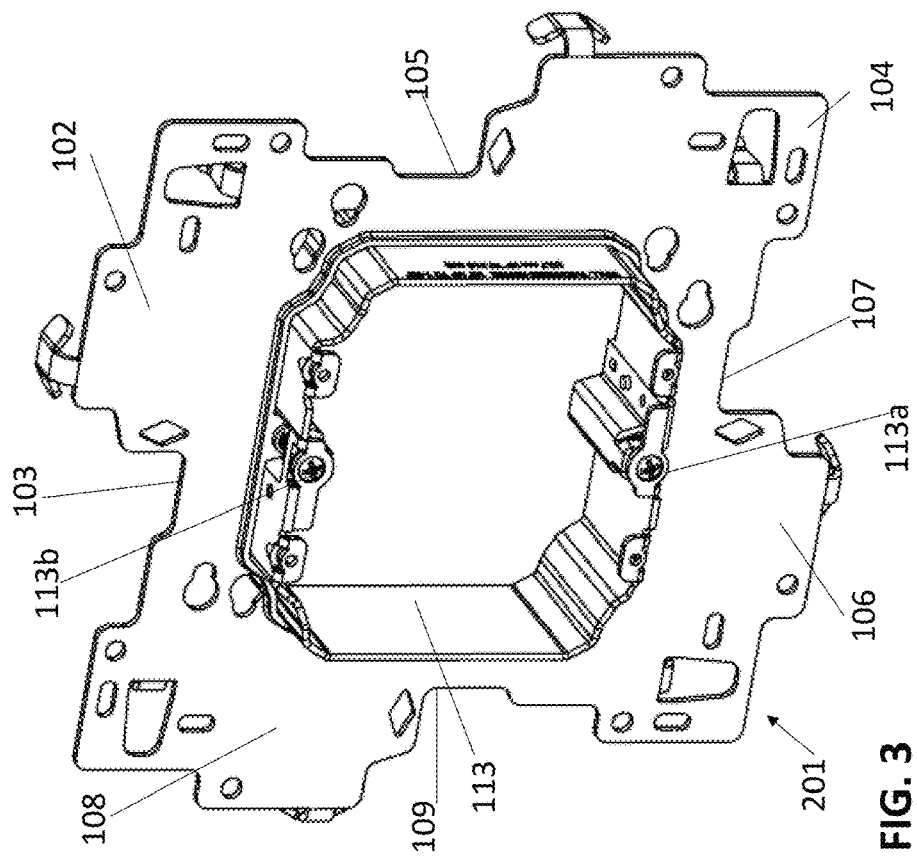
FIG. 3 is a front perspective view of a double gang cover plate according to the present disclosure.

Referring to the drawings and in particular to FIG. 1, an exemplary embodiment of a single gang cover plate according to the present disclosure is shown and is generally referred to by reference numeral 100 and a double gang cover plate according to the present disclosure is shown in FIG. 3 and is generally referred to by reference numeral 201. Advantageously, single gang cover plate 100 and double gang cover plate 201 are each a universal cover plate that can be snapped-on over a stud 1000, for example, as shown in FIGS. 9-14 freeing a user's hands for an easier installation. Single gang cover plate 100 and double gang cover plate 201 each is symmetrical at the four sides; a user can use the single gang cover plate 100 for horizontal or vertical applications. Single gang cover plate 100 and double gang cover plate 201 can also be mounted on each side of the stud 1000. The depth of single gang cover plate 100 and double gang cover plate 201 each is fully adjustable from 1½ inch to 1⅜ inch so the wall thickness is not an issue anymore. Single gang cover plate 100 and double gang cover plate 201 can also be used for pre-fab (pre-fabricated) applications, where the universal cover plate of single gang cover plate 100 and double gang cover plate 201 can be snapped-on a brace 200 that is adjustable for a hands free mounting.

Referring to FIG. 1, single gang cover plate 100 has a single plate body 112. Single gang cover plate 100 has an opening 111 through single plate body 112. A sleeve 113 is positioned through opening 111 through single plate body 112. Sleeve 113 is slidable in opening 111 through single plate body 112 to increase or decrease a depth D1. Depth D1 is a distance between an outer ridge 115 of sleeve 113 and single plate body 112. Depth D1 is increased or decreased by screws 113a, 113b that attach sleeve 113 to single plate body 112. Screws 113a, 113b are inserted through holes 119a, 119b, respectively, in sleeve 113 and holes 121a, 121b, respectively, as shown in FIG. 2, in single plate body 112 that align with holes in sleeve 113. Rotation of screws 113a, 113b in a first direction decreases a size of depth D1 and rotation of screws 113a, 113b in a second direction that is opposite the first direction increases the size of depth D1. Sleeve 113 has holes 117 to connect to an electrical device (not shown).

Single plate body 112 forms a first flap 102, a second flap 104, a third flap 106 and a fourth flap 108. Single plate body 112 has a first cutout 103, a second cut out 105, a third cutout 107 and a fourth cutout 109. First flap 102 is formed between first cutout 103 and second cutout 105. Second flap 104 is formed between second cut out 105 and third cutout 107. Third flap 106 is formed between third cutout 107 and fourth cutout 109. Fourth flap 108 is formed between fourth cutout 109 and first cutout 103. Single plate body 112 has a diamond shape hole 110, a first stud hole 114, a first brace hole 116, a gap 118, a second brace hole 120, a second stud hole 122, a first box hole 123, and a second box hole 124 through first flap 102. A stud tab 126 extends from first flap 102. Stud tab 126 is bent inward. Stud tab 126 has a free end with members 128, 130 that extend from opposite sides of stud tab 126. Members 128, 130 are bent inward toward each other. A projection 132 extends through gap 118. Projection 132 is bent at a free end to form a hook portion 134.

Still referring to FIG. 1, single plate body 112 has a diamond shape hole 136, a first stud hole 138, a first brace hole 140, a gap 142, a second brace hole 144, a second stud hole 146, a first box hole 147 and a second box hole 148 through second flap 104. A stud tab 150 extends from second flap 104. Stud tab 150 is bent inward. Stud tab 150 has a free end with members 152, 154 that extend from opposite sides of stud tab 150. Members 152, 154 are bent inward toward each other. A projection 156 extends through gap 142. Projection 156 is bent at a free end to form a hook portion 158.

Single plate body 112 has a diamond shape hole 160, a first stud hole 162, a first brace hole 164, a gap 166, a second brace hole 168, a second stud hole 170, a box hole 171 and a box hole 172 through third flap 106. A stud tab 174 extends from third flap 106. Stud tab 174 is bent inward. Stud tab 174 has a free end with members 176, 178 that extend from opposite sides of stud tab 174. Members 176, 178 are bent inward toward each other. A projection 180 extends through gap 166. Projection 180 is bent at a free end to form a hook portion 182, as shown in FIG. 2.

Still referring to FIG. 1, single plate body 112 has a diamond shape hole 184, a first stud hole 186, a first brace hole 188, a gap 190, a second brace hole 192, a second stud hole 194, a first box hole 196 and a second box hole 198 through fourth flap 108. A stud tab 1001 extends from fourth flap 108. Stud tab 1001 is bent inward. Stud tab 1001 has a free end with members 1002, 1004 that extend from opposite sides of stud tab 1001. Members 1002, 1004 are bent inward toward each other. A projection 1006 extends through gap 190. Projection 1006 is bent at a free end to form a hook portion 1008, as shown in FIG. 2.

Figure 4:
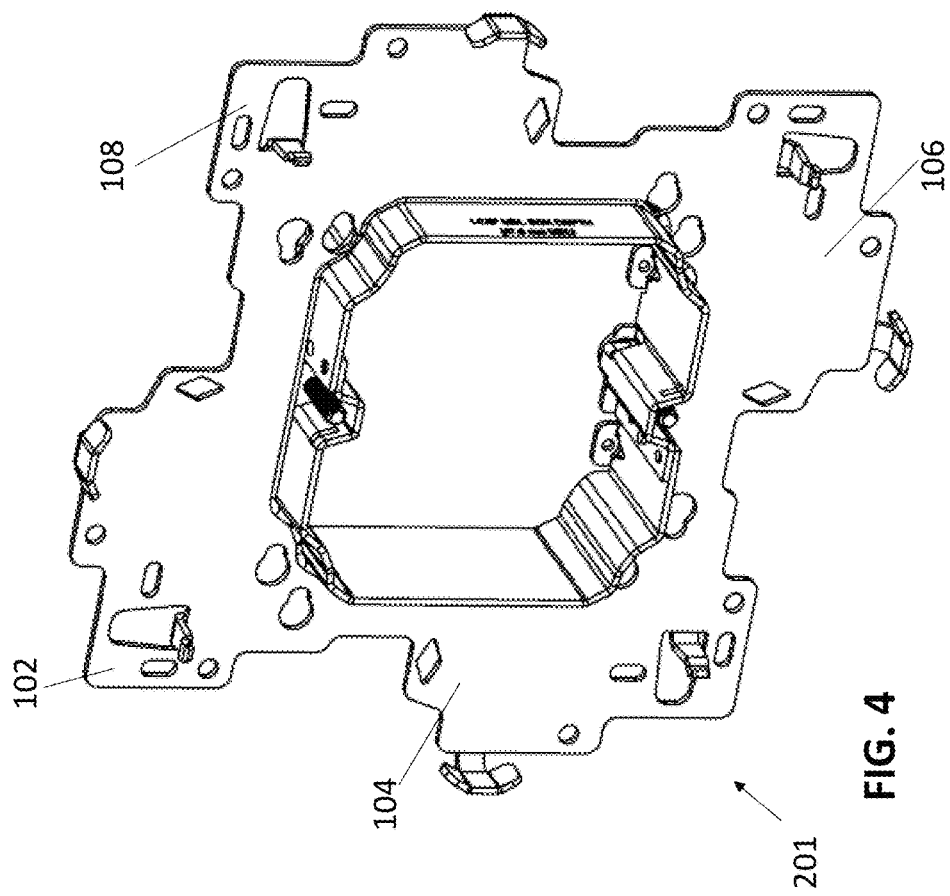
FIG. 4 is a rear perspective view of FIG. 3.

Referring to FIGS. 3 and 4, double gang cover plate 201 is the same as single gang cover plate 100 except double gang cover plate 201 has different dimensions, and, accordingly, the same reference numerals are used. Single gang cover plate 100 and double gang cover plate 201 can be modified to have different dimensions while maintaining the same features to accommodate different electrical devices.

Figure 6:
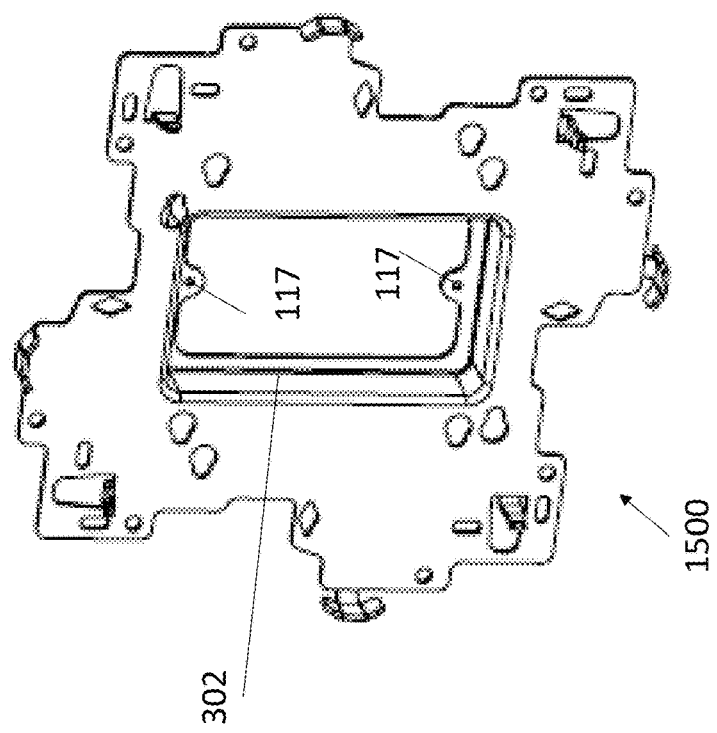
FIG. 6 is a rear perspective view of FIG. 5.
Figure 5:
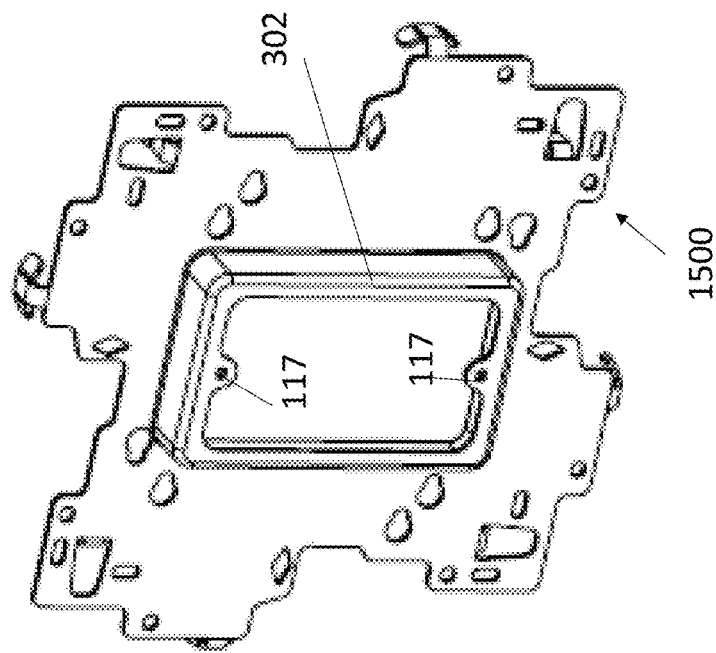
FIG. 5 is a front perspective view of the single gang cover plate of FIG. 1 modified to replace a sleeve with a flange.
Figure 8:
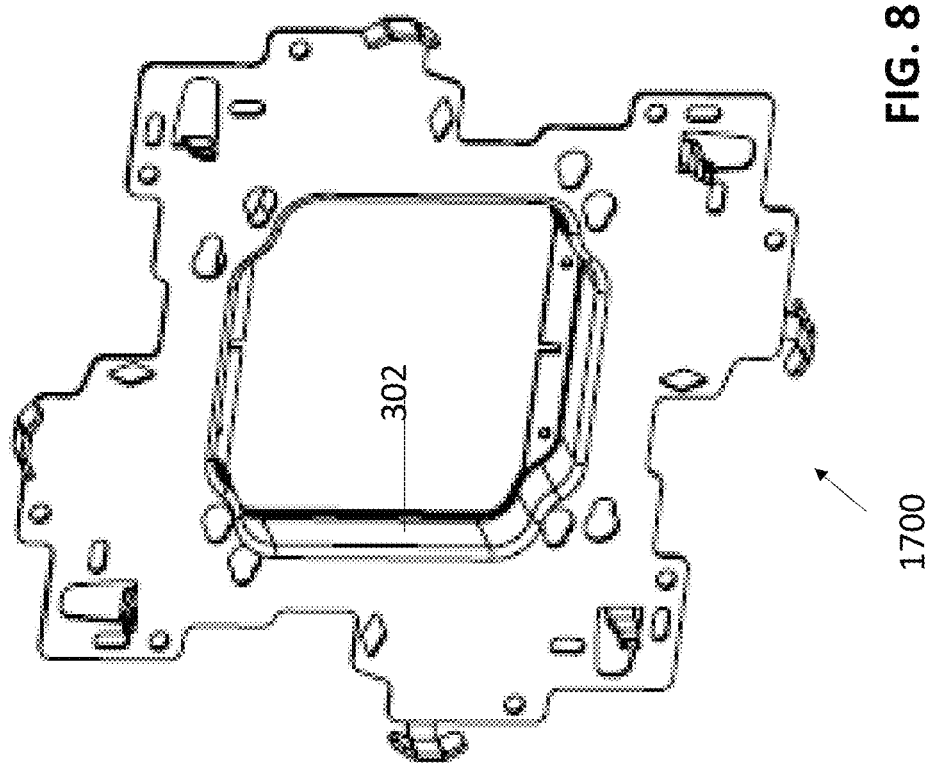
FIG. 8 is a rear perspective view of FIG. 7.
Figure 7:
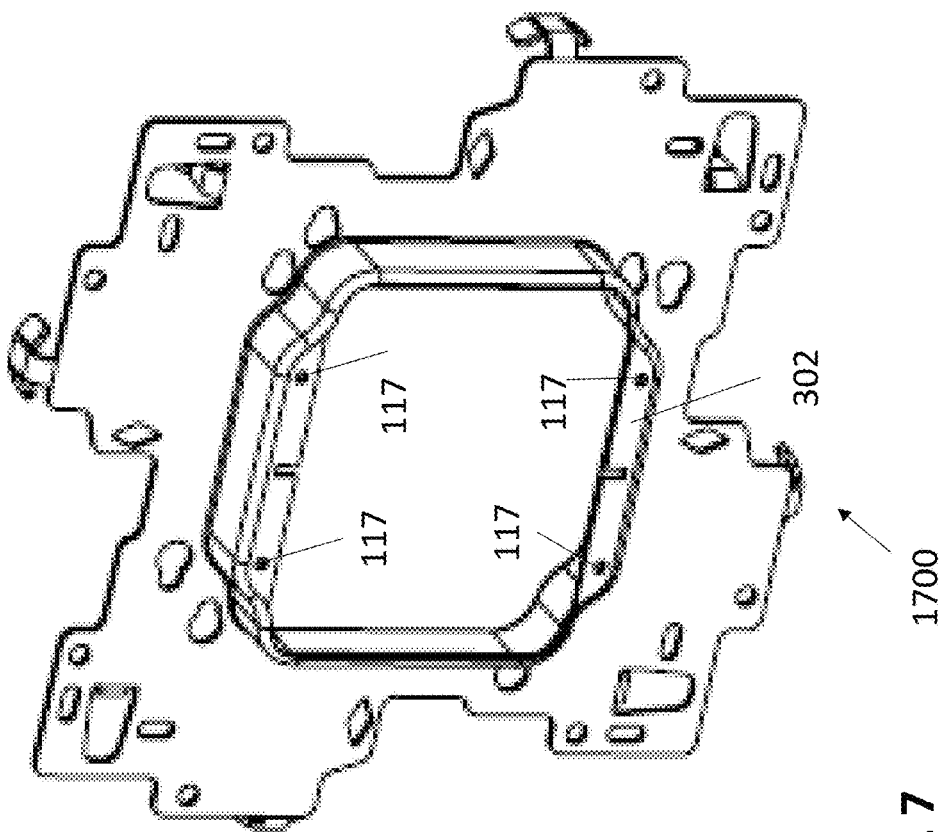
FIG. 7 is a front perspective view of the double gang cover plate of FIG. 3 modified to replace a sleeve with a flange.

Referring to FIGS. 5 and 6, single gang cover plate 1500 is the same as single gang cover plate 100 except single gang cover plate 1500 is modified to replace sleeve 113 with a flange 302. Referring to FIGS. 7 and 8, double gang cover plate 1700 is the same as is the same as double gang cover plate 201 except double gang cover plate 1700 is modified to replace sleeve 113 with flange 302. Flange 302 has holes 117 to connect single gang cover plate 1500 or double gang cover plate 1700 to an electrical device (not shown).

Referring to FIGS. 9-14, single gang cover plate 1600 is modified to replace flange 302 with connector holes 900. Single gang cover plate 1600 is connectable to stud 1000 in four different orientations, namely, a first orientation, as shown in FIGS. 9-14, a second orientation, a third orientation, and a fourth orientation, as shown in FIG. 16. The second orientation rotates single gang cover plate 1600 90 degrees counterclockwise from the first orientation shown in FIG. 11, the third orientation rotates single gang cover plate 1600 180 degrees counterclockwise from the first orientation shown in FIG. 11, and the fourth orientation rotates single gang cover plate 1600 270 degrees counterclockwise from the first orientation shown in FIG. 11. Single gang cover plate 100, 1600 connects to stud 1000 the same as double gang cover plate 201, 1700.

Referring to FIGS. 9-14, to connect single gang cover plate 1600 to stud 1000 in the first orientation, stud tab 1001 of fourth flap 108 contacts a first side 1701 of stud 1000 and single gang cover plate 1600 is moved to position projection 1006 of fourth flap 108 and projection 180 of third flap 106 on a second side 1702 of stud 1000 that is opposite first side 1701 to connect single gang cover plate 1600 by a snap connection to stud 1000 for handsfree installation. Stud tab 1001 of fourth flap 108, projection 1006 of fourth flap 108 and projection 180 of third flap 106 maintain single gang cover plate 1600 in place on stud 1000, and, if single gang cover plate 1600 is connected to an electrical box, then stud tab 1001 of fourth flap 108, projection 1006 of fourth flap 108 and projection 180 of third flap 106 maintain single gang cover plate 1600 that is connected to the electrical box in place on stud 1000. A first fastener 304, for example, a screw shown in FIG. 15, is inserted through first stud hole 186 of fourth flap 108 and stud 1000 and a second fastener 306, for example, a screw shown in FIG. 15, is inserted through second stud hole 170 of third flap 106 to secure single gang cover plate 1600 to stud 1000. An electrical device (not shown) can be connected to single gang cover plate 1600 by fasteners, for example, screws, that each pass through one of holes in the electrical device that align with one of holes 117 through sleeve 113, holes 1117 through flange 302 or connector holes 900.

Alternatively, single gang cover plate 1600 connects to stud 1000 in the second orientation by stud tab 174 of third flap 106 contacting first side 1701 of stud 1000 and then positioning projection 180 of third flap 106 and projection 156 of second flap 104 on second side 1702 of stud 1000 that is opposite first side 1701 that maintains single gang cover plate 1600 in place on stud 1000, and, if single gang cover plate 1600 is connected to an electrical box, then stud tab 174 of third flap 106, projection 180 of third flap 106 and projection 156 of second flap 104 maintain single gang cover plate 1600 that is connected to the electrical box in place on stud 1000 by a snap connection. First fastener 304 is then inserted through first stud hole 162 of third flap 106 and stud 1000 and second fastener 306 is inserted through second stud hole 146 of second flap 104 to secure single gang cover plate 1600 to stud 1000. Another alternative is single gang cover plate 1600 connects to stud 1000 in the third orientation by stud tab 150 of second flap 104 contacting first side 1701 of stud 1000 and then positioning projection 156 of second flap 104 and projection 132 of first flap 102 on second side 1702 of stud 1000 that is opposite first side 1701 that maintains single gang cover plate 1600 in place on stud 1000, and, if single gang cover plate 1600 is connected to an electrical box, then stud tab 150 of second flap 104, projection 156 of second flap 104 and projection 132 of first flap 102 maintain single gang cover plate 1600 that is connected to the electrical box in place on stud 1000 by a snap connection. First fastener 304 is then inserted through first stud hole 138 of second flap 104 and stud 1000 and second fastener 306 is inserted through second stud hole 122 of first flap 102 to secure single gang cover plate 1600 to stud 1000. Still another alternative is single gang cover plate 1600 connects to stud 1000 in a fourth orientation by stud tab 126 of first flap 102 contacting first side 1701 of stud 1000 and then positioning projection 132 of first flap 102 and projection 1006 of fourth flap 108 on second side 1702 of stud 1000 that is opposite first side 1701 that maintains single gang cover plate 1600 in place on stud 1000, and, if single gang cover plate 1600 is connected to an electrical box, then stud tab 126 of first flap 102, projection 132 of first flap 102 and projection 1006 of fourth flap 108 maintain single gang cover plate 1600 that is connected to the electrical box in place on stud 1000 by a snap connection. First fastener 304 is then inserted through first stud hole 114 of first flap 102 and stud 1000 and second fastener 306 is inserted through second stud hole 194 of fourth flap 108 to secure single gang cover plate 1600 to stud 1000.

Referring to FIG. 15, a first single gang cover plate 100*a* is connected on a first side of stud 1000 and a second single gang cover plate 100*b* is connected on a second side of stud 1000 that is opposite the first side of stud 1000 in a gang configuration. First single gang cover plate 100*a* and second single gang cover plate 100*b* are the same as single gang cover plate 1600, and, accordingly, use the same reference numerals. First single gang cover plate 100*a* is connected to stud 1000 in the first orientation that is the same as FIGS. 9-14 for single gang cover plate 1600 described herein. First single gang cover plate 100*a* is also connected to a first electrical box 300. First single gang cover plate 100*a* is connected to first electrical box 300 by a fastener 303, for example, a screw, that passes through box hole 172 through third flap 106 and a hole through first electrical box 300 that is aligned with box hole 172 through third flap 106 and a fastener 305, for example, a screw, that passes through second box hole 124 through first flap 102 and a hole through first electrical box 300 that is aligned with second box hole 124 to secure first single gang cover plate 100*a* to first electrical box 300. Stud tab 1001 of first single gang cover plate 100*a* can contact first side 1701 of stud 1000 through second cutout 105 of second single gang cover plate 100*b*. Second single gang cover plate 100*b* can connect in a fifth orientation on the opposite side of stud 1000 by stud tab 150 of second flap 104 contacting second side 1702 of stud 1000 and positioning projection 156 of second flap 106 and projection 132 of first flap 102 on first side 1701 of stud 1000. Stud tab 150 of second single gang cover plate 100*b* can contact second side 1702 of stud 1000 through fourth cutout 109 of first single gang cover plate 100*a*. Stud tab 150 of second flap 104, projection 156 of second flap 106 and projection 132 of first flap 102 maintain second single gang cover plate 100*b* in place on stud 1000, and, if second single gang cover plate 100*b* is connected to an electrical box, for example, another first electrical box 300, then stud tab 150 of second flap 104, projection 156 of second flap 106 and projection 132 maintain second single gang cover plate 100*b* that is connected to electrical box 300 in place on stud 1000 by a snap connection. Third fastener 308 is inserted through second stud hole 122 of first flap 102 and stud 1000 and fourth fastener 310 is inserted through first stud hole 138 of second flap 104 to secure second single gang cover plate 100*b* to stud 1000. An electrical device (not shown) can be connected to second single gang cover plate 100*b* by fasteners, for example, screws, that each pass through one of holes in the electrical device that align with one of holes 117 through sleeve 113 or holes 117 through flange 302. Third flap 106 and fourth flap 108 of first single gang cover plate 100*a* are complementary in shape to first flap 102 and second flap 104 of second single gang cover plate 100*b* allowing first single gang cover plate 100*a* and second single gang cover plate 100*b* to be mounted side-by-side on each side of the stud 1000.

Referring to FIG. 16, first single gang cover plate 100*a* is connected to stud 1000 in the fourth orientation that is the same single gang cover plate 1600 described herein. Stud tab 126 of first single gang cover plate 100*a* can contact first side 1701 of stud 1000 through first cutout 103 of first single gang cover plate 100*b*. Second single gang cover plate 100*b* can be connected to the opposite side of stud 1000 in a sixth orientation that is rotated 90 degrees clockwise from the fifth orientation of FIG. 11 by stud tab 126 of first flap 102 contacting second side 1702 of stud 1000, as shown in FIG. 18, positioning projection 132 of first flap 102 and projection 1006 of fourth flap 108 on first side 1701 of stud 1000 maintaining second single gang cover plate 100*b* in place on stud 1000, and, if second single gang cover plate 100*b* is connected to an electrical box, for example, another first electrical box 300, then stud tab 126 of first flap 102, projection 132 of first flap 102 and projection 1006 of fourth flap 108 maintain second single gang cover plate 100*b* that is connected to electrical box 300 in place on stud 1000 by snap connection. Stud tab 126 of second single gang cover plate 100*b* can contact second side 1702 of stud 1000 through first cutout 103, as shown in FIG. 18, of first single gang cover plate 100*a*. Third fastener 308 is inserted through second stud hole 194 of fourth flap 108 and stud 1000 and fourth fastener 310 is inserted through first stud hole 114 of first flap 102 and stud 1000 to secure single gang cover plate 100*b* to stud 1000.

Alternatively, second single gang cover plate 100*b* can be connected to the opposite side of stud 1000 in a seventh orientation that is rotated by 180 degrees from the fifth position shown in FIG. 15 by stud tab 1001 of fourth flap 108 contacting second side 1702 of stud 1000 positioning projection 1006 of fourth flap 108 and projection 180 of third flap 106 on first side 1701 of stud 1000 maintaining second single gang cover plate 100*b* in place on stud 1000, and, if single gang cover plate 100*b* is connected to an electrical box, for example, first electrical box 300, then stud tab 1001 of fourth flap 108, projection 1006 of fourth flap 108 and projection 180 of third flap 106 maintain single gang cover plate 100*b* that is connected to electrical box 1200 in place on stud 1000 by a snap connection. Third fastener 308 is inserted through second stud hole 170 of third flap 106 and stud 1000 and fourth fastener 310 is inserted through first stud hole 186 of fourth flap 108 and stud 1000 to secure single gang cover plate 100*b* to stud 1000.

One further alternative is that second single gang cover plate 100*b* can be connected to the opposite side of stud 1000 in an eighth orientation that is rotated by 270 degrees from the fifth position shown in FIG. 15 by stud tab 174 of third flap 106 contacting second side 1702 of stud 1000 positioning projection 180 of third flap 106 and projection 156 of second flap 104 on first side 1701 of stud 1000 maintaining second single gang cover plate 100*b* in place on stud 1000, and, if single gang cover plate 100*b* is connected to an electrical box, for example, first electrical box 300, then stud tab 174 of third flap 106, projection 180 of third flap 106 and projection 156 of second flap 104 maintain single gang cover plate 100*b* that is connected to electrical box 300 in place on stud 1000 by a snap connection. Third fastener 308 is inserted through second stud hole 146 of second flap 104 and stud 1000 and fourth fastener 310 is inserted through first stud hole 162 of third flap 106 and stud 1000 to secure single gang cover plate 100b to stud 1000.

Accordingly, each of first flap 102, second flap 104, third flap 106, fourth flap 108, first cutout 103, second cutout 105, third cutout 107 and fourth cutout 109 of first single gang cover plate 100a is complementary in shape with each of first flap 102, second flap 104, third flap 106, fourth flap 108, first cutout 103, second cutout 105, third cutout 107 and fourth cutout 109 of second single gang cover plate 100b allowing first single gang cover plate 100a to be mounted side-by-side with second single gang cover plate 100b on stud 1000 where first single gang cover plate 100a can be mounted on stud 1000 in any one of the first orientation, the second orientation, the third orientation or the fourth orientation and second single gang cover plate 100b can be mounted on stud 1000 in any one of the fifth orientation, the sixth orientation, the seventh orientation or the eighth orientation.

Alternatively, second single gang cover plate 100b can be connected in any one of the fifth orientation, the sixth orientation, the seventh orientation or the eighth orientation on the second side of stud 1000 without first single gang cover plate 100a being connected to stud 1000.

Referring to FIGS. 17 and 18, first single gang cover plate 100a is connected to a second electrical box 1740 that is a 4 11/16 inch electrical box and second single gang cover plate 100b is connected to a third electrical box 1742 that is a 4 inch electrical box. First single gang cover plate 100a and second single gang cover plate 100b can be connected to different sized electrical boxes by passing one or more fasteners, for example, screws, through one or more of and box holes 123, 124, 147, 148, 171, 172, 196, 198 that align with corresponding holes through the different sized electrical boxes.

Figure 19:
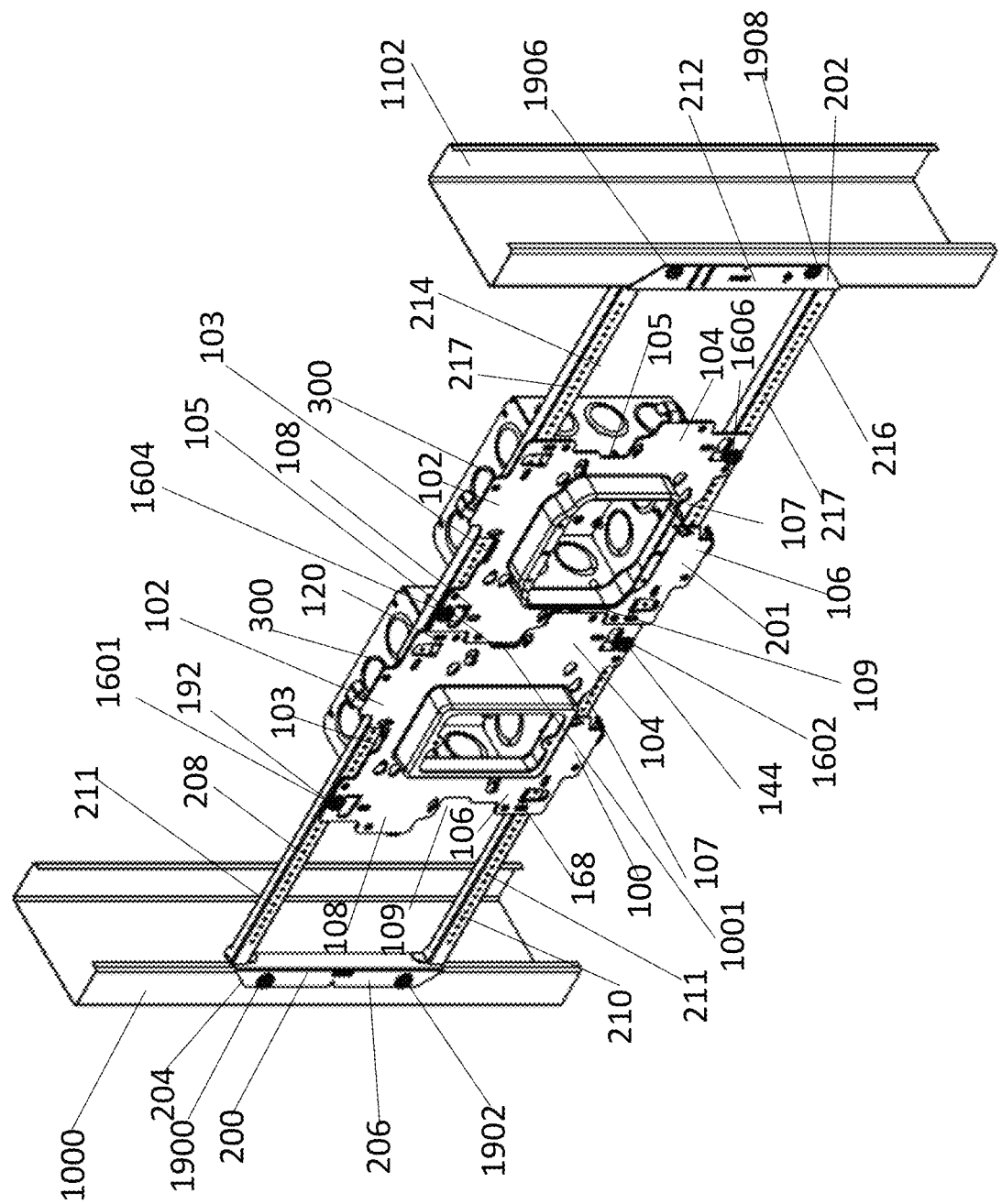
FIG. 19 is a front perspective view of the single gang cover plate of FIG. 5 connected to the first electrical box and the double gang cover plate of FIG. 7 connected to another first electrical box that are connected to a brace.
Figure 22:
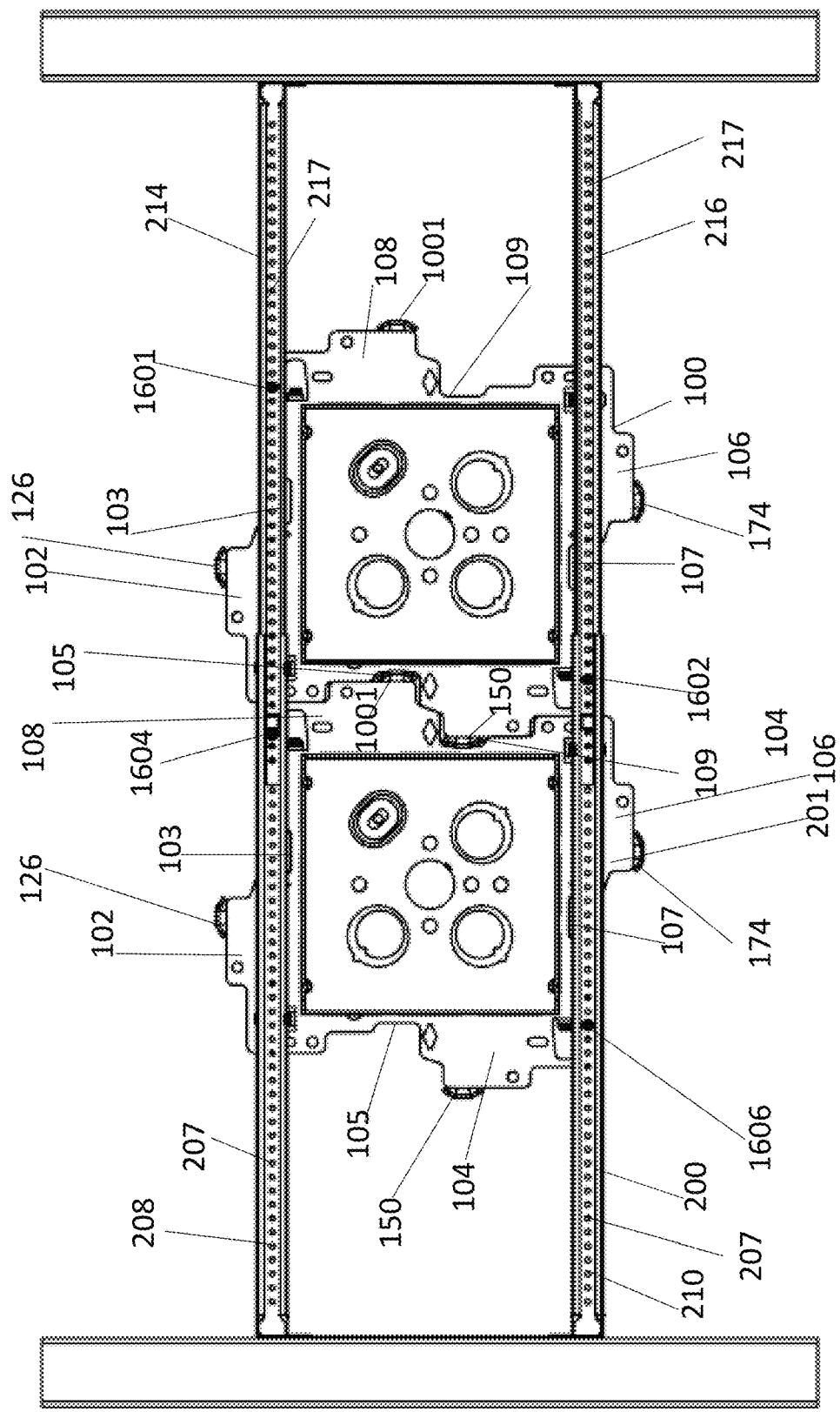
FIG. 22 is a rear view of FIG. 19.

Referring to FIG. 19, brace 200 allows one or more electrical boxes, for example, electrical box 300, to connect by one or more single gang cover plates 100 and/or double gang cover plates 201 between two studs 1000, 1102. Single gang cover plate 100 connects to brace 200 the same as double gang cover plate 201. Brace assembly 200 has an inner brace member 202 and an outer brace member 204. Outer brace member 204 has an outer end support 206 and a first outer rail 208 and a second outer rail 210 extending from outer end support 206. Outer end support 206 has two holes to receive fasteners 1900, 1902 to connect brace 200 to stud 1000. First outer rail 208 and a second outer rail 210 have holes 211. Inner brace member 202 has an inner end support 212 and a first inner rail 214 and a second inner rail 216 extending from inner end support 212. Inner end support 212 has two holes to receive fasteners 1906, 1908 connecting brace 200 to stud 1102. First inner rail 214 and second inner rail 216 have holes 217. First outer rail 208, second outer rail 210, first inner rail 214 and second inner rail 216 each have a C-shaped cross-section. The C-shaped cross-section of first inner rail 214 is sized smaller than the C-shaped cross-section of first outer rail 208 so that first outer rail 208 fits over first inner rail 214 and the C-shaped cross-section of second inner rail 216 is sized smaller than the C-shaped cross-section of second outer rail 210 so that second outer rail 210 fits over second inner rail 216 allowing first outer rail 208 and second outer rail 210 to slide on first inner rail 214 and second inner rail 216, respectively, to move outer end support 206 and inner end support 212 toward and away from one another adjusting a size of brace assembly 200. A stop structure such as depressions in each of first outer rail 208 and second outer rail 210 that each fit in one of depressions in first inner rail 214 and second inner rail 216 at a maximum distance outer end support 206 and inner end support 212 can be apart is included so that inner brace member 202 and outer brace member 204 are prevented from separating.

Figure 23:
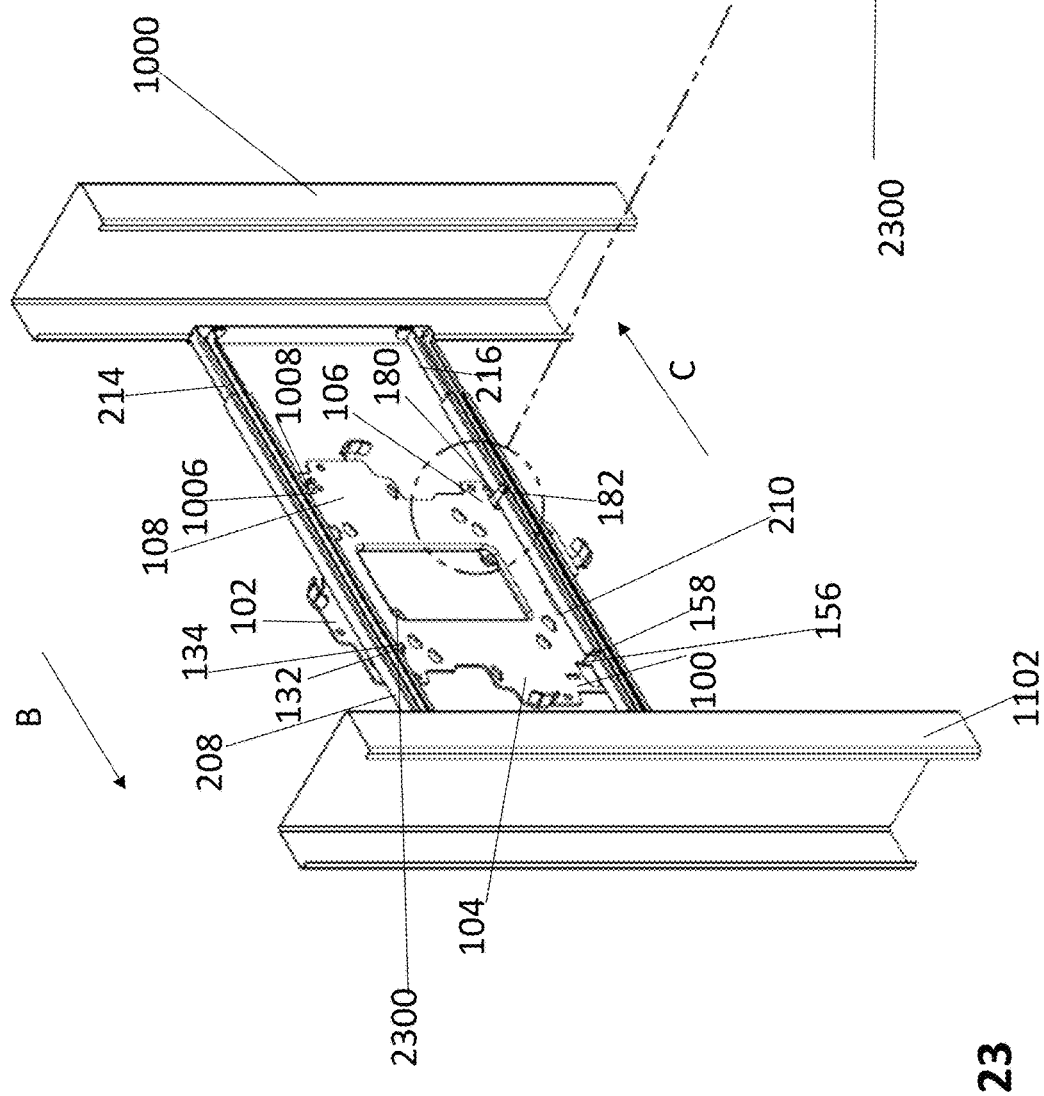
FIG. 23 is a rear perspective view of the single gang cover plate of FIG. 1 modified to replace the sleeve with connector holes and connected to the brace.
Figure 24:
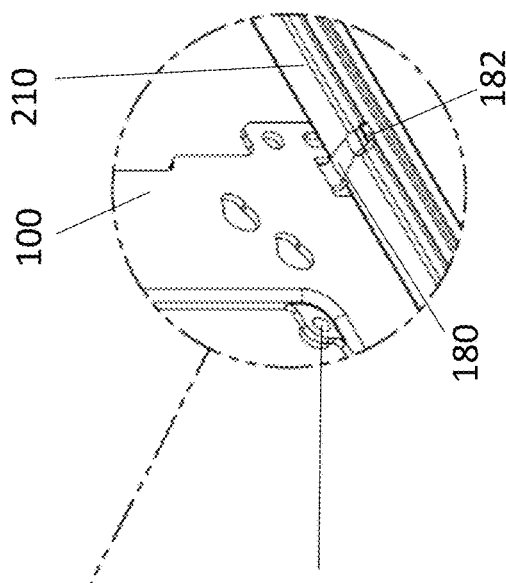
FIG. 24 is an enlarged partial perspective view of FIG. 23.

Referring to FIGS. 23 and 24, single gang cover plate 100 that is modified to replace sleeve 113 with connector holes 2300 is connected to brace 200. Single gang cover plate 100 is connected between first outer rail 208 and second outer rail 210 in a first brace orientation by moving single gang cover plate 100 so that projection 132 of first flap 102, projection 156 of second flap 104, projection 180 of third flap 106 and projection 1006 of fourth flap 108 are in between first outer rail 208 and second outer rail 210 of outer brace member 204. Hook portion 134 of projection 132 is positioned around a rear portion of first outer rail 208. Hook portion 182 of projection 180 is positioned around a rear portion of second outer rail 210. Projection 132 of first flap 102, projection 156 of second flap 104, projection 180 of third flap 106 and projection 1006 of fourth flap 108 allow single gang cover plate 100 to slide in a first direction B and/or a second direction C between first outer rail 208, first inner rail 214, second outer rail 210 and second inner rail 216 to a desired position. Projection 132 of first flap 102, projection 156 of second flap 104, projection 180 of third flap 106 and projection 1006 of fourth flap 108 maintain single gang cover plate 100 in place on brace 200 by a snap connection for handsfree installation so that a first fastener 1601 can then be inserted through first brace hole 192 of fourth flap 102 and hole 211 of first outer rail 208 and/or hole 217 of first inner rail 214 and a second fastener 1602 can be inserted through second brace hole 144, hole 211 of second outer rail 210 and/or hole 217 of second inner rail 216, as shown in FIG. 19 to secure single gang cover plate 100 to brace 200. Double gang cover plate 201 is connected to brace the same as single gang cover plate 100.

Single gang cover plate 100 can be rotated 90 degrees clockwise from the position shown in FIG. 19 to a second brace orientation and is connectable to brace 200 by moving single gang cover plate 100 so that projection 132 of first flap 102, projection 156 of second flap 104, projection 180 of third flap 106 and projection 1006 of fourth flap 108 are in between first outer rail 208 and second outer rail 210 of outer brace member 204. Hook portion 1008 of projection 1006 is positioned around the rear portion of first outer rail 208. Hook portion 158 of projection 156 is positioned around the rear portion of second outer rail 210. Projection 132 of first flap 102, projection 156 of second flap 104, projection 180 of third flap 106 and projection 1006 of fourth flap 108 allow single gang cover plate 100 to slide in first direction B and/or second direction C between first outer rail 208 of outer brace member 204 that overlaps first inner rail 214 of inner brace member 202 and second outer rail 210 that overlaps second inner rail 216 to a desired position. Projection 132 of first flap 102, projection 156 of second flap 104, projection 180 of third flap 106 and projection 1006 of fourth flap 108 maintain single gang cover plate 100 in place on brace 200 by a snap connection so that first fastener 1601 can be inserted through second brace hole 168 of third flap 108 and hole 211 of first outer rail 208 and/or hole 217 of first inner rail 214 and second fastener 1602 can be inserted through second brace hole 120, hole 211 of second outer rail 210 and/or hole 217 of second inner rail 216 to secure single gang cover plate 100 to brace 200.

Single gang cover plate 100 can be rotated 180 degrees clockwise from the position shown in FIG. 19 to a third brace orientation and is connectable to brace 200 by moving single gang cover plate 100 so that projection 132 of first flap 102, projection 156 of second flap 104, projection 180 of third flap 106 and projection 1006 of fourth flap 108 are in between first outer rail 208 and second outer rail 210 of outer brace member 204. Hook portion 182 of projection 180 is positioned around the rear portion of first outer rail 208. Hook portion 134 of projection 132 is positioned around a rear portion of second outer rail 210. Projection 132 of first flap 102, projection 156 of second flap 104, projection 180 of third flap 106 and projection 1006 of fourth flap 108 allow single gang cover plate 100 to slide in first direction B and/or second direction C between first outer rail 208 of outer brace member 204 that overlaps first inner rail 214 of inner brace member 202 and second outer rail 210 that overlaps second inner rail 216 to a desired position. Projection 132 of first flap 102, projection 156 of second flap 104, projection 180 of third flap 106 and projection 1006 of fourth flap 108 maintain single gang cover plate 100 in place on brace 200 by a snap connection so that first fastener 1601 can be inserted through second brace hole 144 of second flap 104 and hole 211 of first outer rail 208 and/or hole 217 of first inner rail 214 and second fastener 1602 can be inserted through second brace hole 192, hole 211 of second outer rail 210 and/or hole 217 of second inner rail 214.

Single gang cover plate 100 can be rotated 270 degrees clockwise from the position shown in FIG. 19 to a fourth brace orientation and is connectable to brace 200 by moving single gang cover plate 100 so that projection 132 of first flap 102, projection 156 of second flap 104, projection 180 of third flap 106 and projection 1006 of fourth flap 108 are in between first outer rail 208 and second outer rail 210 of outer brace member 204. Hook portion 158 of projection 156 is positioned around the rear portion of first outer rail 208. Hook portion 1008 of projection 1006 is positioned around a rear portion of second outer rail 210. Projection 132 of first flap 102, projection 156 of second flap 104, projection 180 of third flap 106 and projection 1006 of fourth flap 108 allow single gang cover plate 100 to slide in first direction B and/or second direction C between first outer rail 208 of outer brace member 204 that overlaps first inner rail 214 of inner brace member 202 and second outer rail 210 that overlaps second inner rail 216 to a desired position. Projection 132 of first flap 102, projection 156 of second flap 104, projection 180 of third flap 106 and projection 1006 of fourth flap 108 maintain single gang cover plate 100 in place on brace 200 by a snap connection so that first fastener 1601 can be inserted through second brace hole 120 of first flap 102, hole 211 of first outer rail 208 and/or hole 217 of first inner rail 214 and second fastener 1602 can be inserted through second brace hole 168, hole 211 of second outer rail 210 and hole 217 of second inner rail 216.

Alternatively, projection 132 of first flap 102, projection 156 of second flap 104, projection 180 of third flap 106 and projection 1006 of fourth flap 108 can be between first inner rail 214 and second inner rail 216 of inner brace member 202 and/or first outer rail 208 and second outer rail 210 of outer brace member 204 depending on a distance between first stud 1000 and second stud 1102 and a position of single gang cover plate 100 and/or double gang cover plate 201 on brace 200.

Referring to FIGS. 19-22, single gang cover plate 100 and double gang cover plate 201 are mounted side-by-side on brace 200. Double gang cover plate 201 has a third fastener 1604 through first brace hole 192 of fourth flap 102, hole 211 of first outer rail 208 and hole 217 of first inner rail 214, and a fourth fastener 1606 through second brace hole 144 and hole 217 of second inner rail 216. Single gang cover plate 100 and double gang cover plate 201 are both connected on brace 200 in the first brace orientation. Each of first cutout 103, second cutout 105, third cutout 107 and fourth cutout 109 of single gang cover plate 100 are shaped to receive one of stud tabs 126, 150, 174, 1001 therein of another of single gang cover plate 100 or double gang cover plate 201. Similarly, each of first cutout 103, second cutout 105, third cutout 107 and fourth cutout 109 of double gang cover plate 201 are shaped to receive one of stud tabs 126, 150, 174, 1001 therein of another of double gang cover plate 201 or single gang cover plate 100. Second cutout 105 of single gang cover plate 100 receives stud tab 1001 of double gang cover plate 201 and fourth cutout 109 of double gang cover plate 201 receives stud tab 150 of single gang cover plate 100 when single gang cover plate 100 and double gang cover plate 201 are mounted side-by-side on brace 200 and are both connected on brace 200 in the first brace orientation as shown in FIGS. 19-22.

Accordingly, each of first flap 102, second flap 104, third flap 106, fourth flap 108, first cutout 103, second cutout 105, third cutout 107 and fourth cutout 109 of single gang cover plate 100 is complementary in shape with each of first flap 102, second flap 104, third flap 106, fourth flap 108, first cutout 103, second cutout 105, third cutout 107 and fourth cutout 109 of another of single gang cover plate 100 or double gang cover plate 201 to be mounted side-by-side with another of single gang cover plate 100 or double gang cover plate 201 on brace 200 where single gang cover plate 100 can be mounted on brace 200 in any one of the first brace orientation, the second brace orientation, the third brace orientation or the brace fourth orientation and another of single gang cover plate 100 or double gang cover plate 201 can be mounted on brace 200 in any one of the first brace orientation, the second brace orientation, the third brace orientation or the brace fourth orientation.

Figure 26:
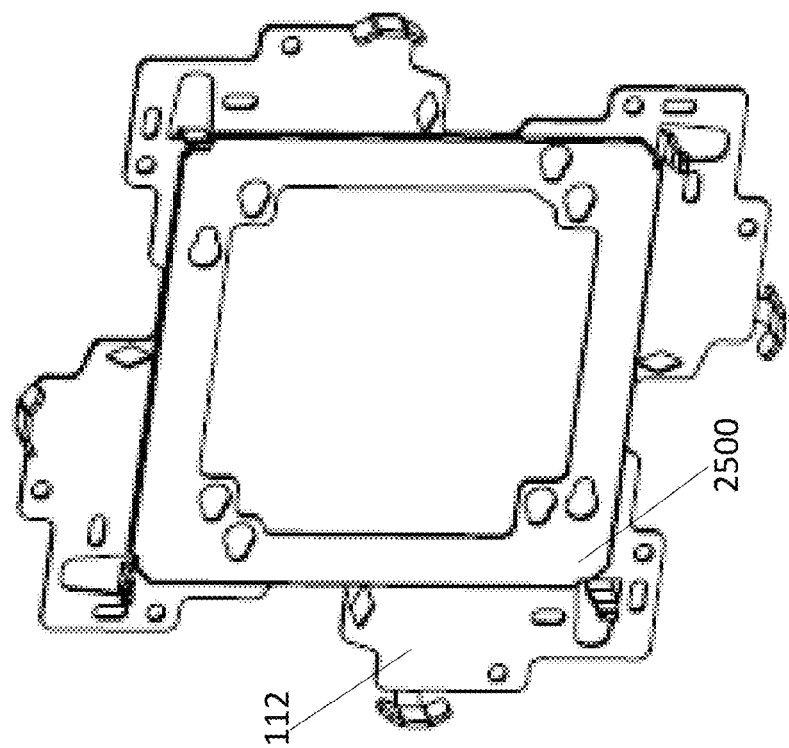
FIG. 26 is a rear perspective view of FIG. 25.
Figure 25:
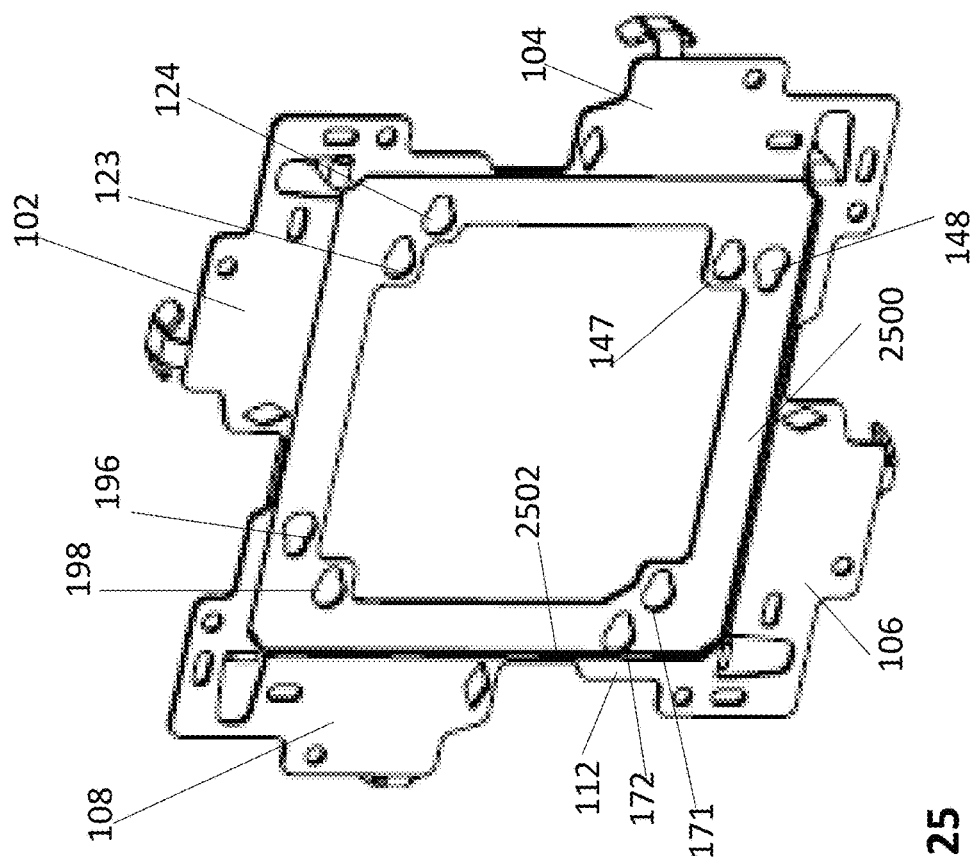
FIG. 25 is a front perspective view of the double gang cover plate of FIG. 3 modified to replace a sleeve with a mud ring receiving portion.
Figure 28:
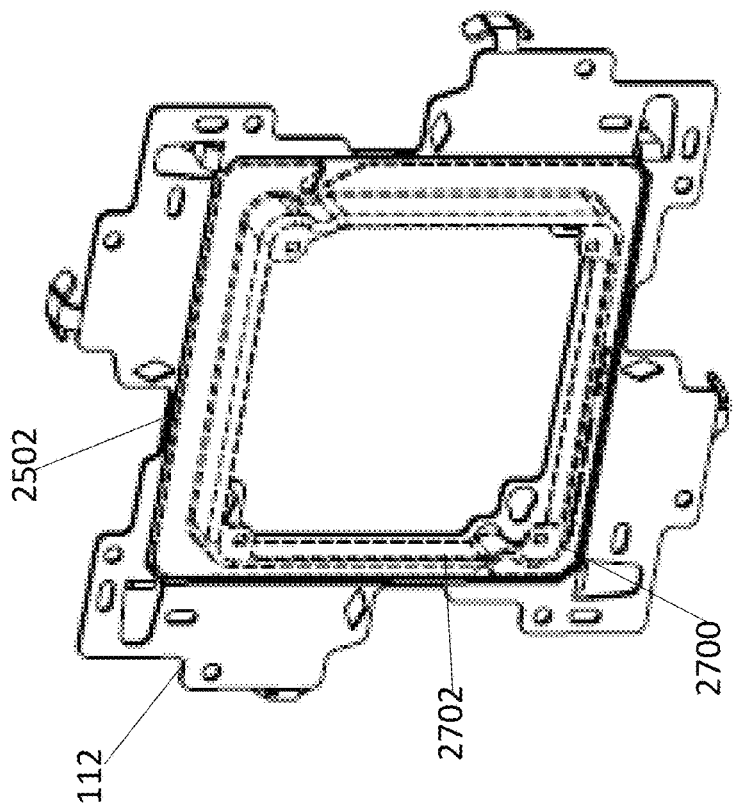
FIG. 28 is a front perspective view of the double gang cover plate of FIG. 25 connected to the mud ring of FIG. 27.
Figure 27:
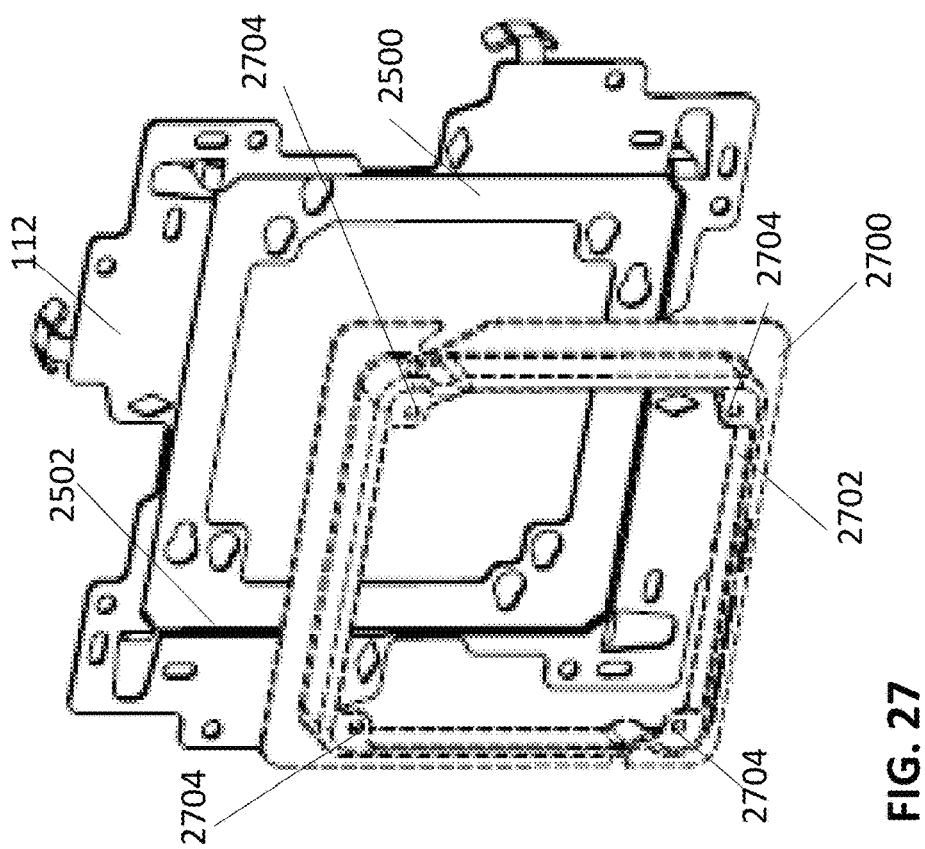
FIG. 27 is a front perspective view of the double gang cover plate of FIG. 25 and a mud ring.

Referring to FIGS. 25 and 26, single gang cover plate 100 and double gang cover plate 201 can each be modified to exclude a mud ring and replace the mud ring with box flange 2500. Plate body 112 has a depression 2502 to form box flange 2500. Box flange 2500 includes box holes 123, 124, 147, 148, 171, 172, 196, 198 through plate body 112. Referring to FIGS. 27-28, plate body 112 can receive a cover 2700 that has a mud ring 2702 to connect to an electrical device (not shown), for example, an electrical outlet, that connects to mud ring 2702 by fasteners, for example, screws, that are inserted through holes 2704. Cover 2700 is inserted in depression 2502 to removably connect cover 2700 to plate body 112. Plate body 112 can receive different covers 2700 each having mud ring 2702 having a different shape, for example, a single mud ring or a double mud ring.

Figure 30:
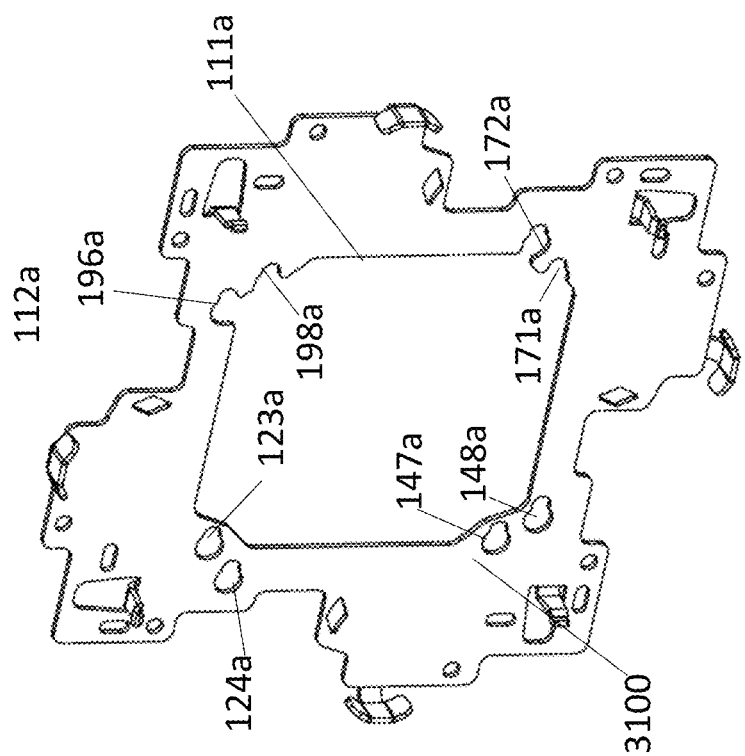
FIG. 30 is a rear perspective view of FIG. 29.
Figure 29:
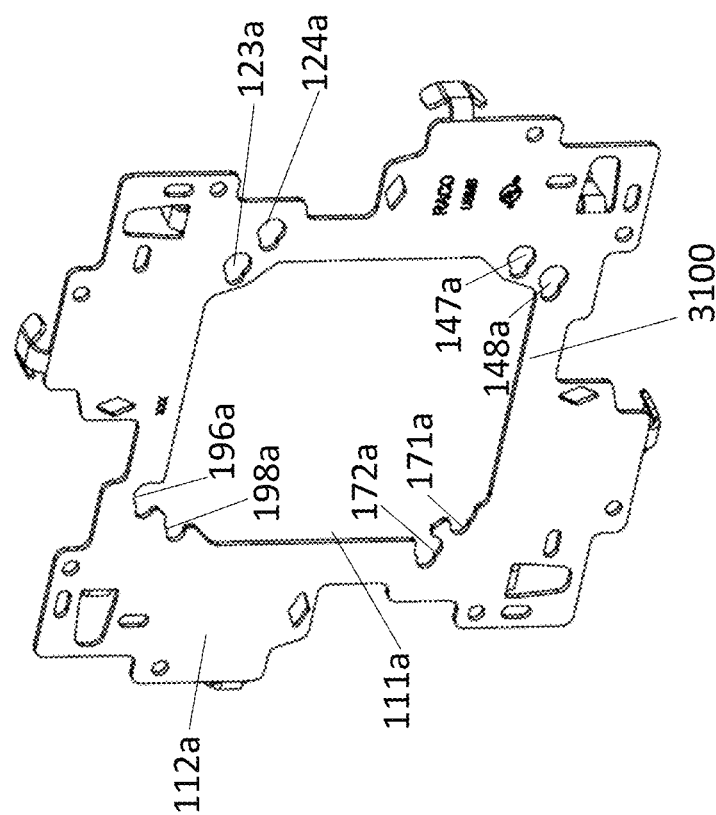
FIG. 29 is a front perspective view of the double gang cover plate of FIG. 3 modified to replace a sleeve with a mud ring fastening portion.
Figure 32:
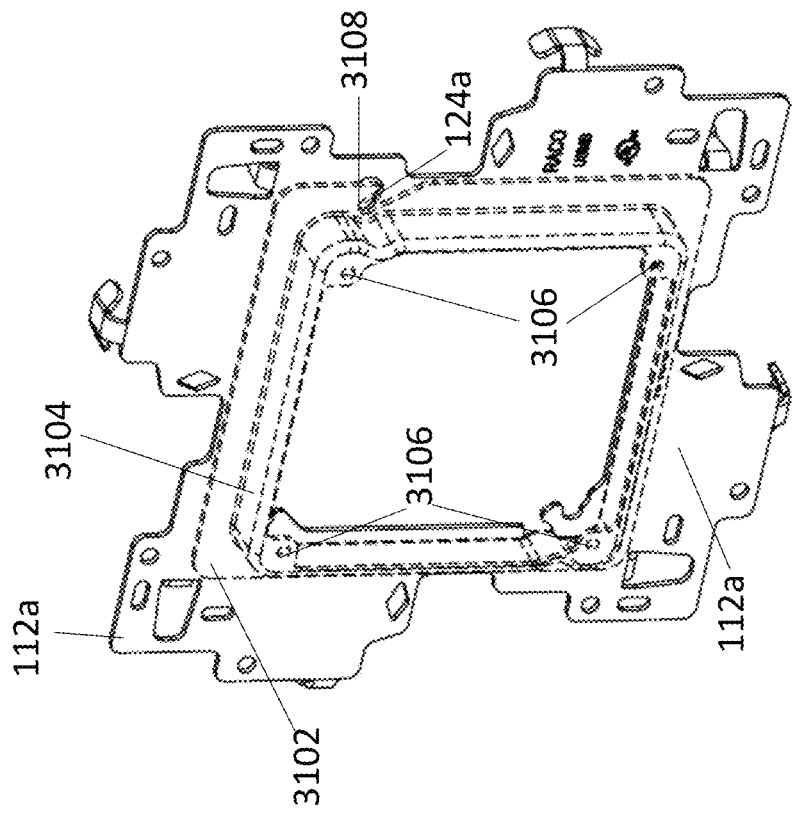
FIG. 32 is a front perspective view of the double gang cover plate of FIG. 29 connected to the mud ring of FIG. 31.
Figure 31:
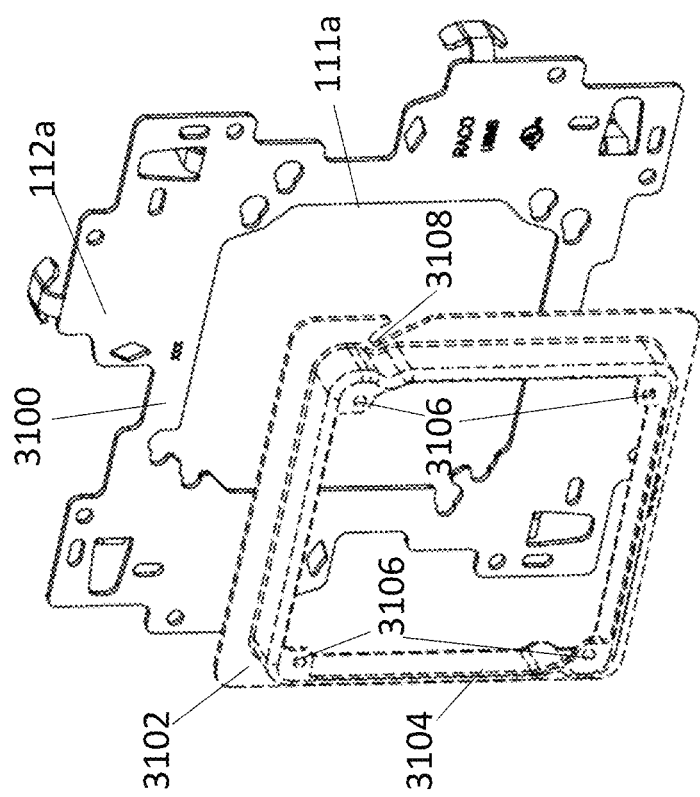
FIG. 31 is a front perspective view of the double gang cover plate of FIG. 29 and a mud ring.

Referring to FIGS. 29 and 30, single gang cover plate 100 and double gang cover plate 201 can each be modified to exclude a mud ring and replace the mud ring so that plate body 112 is modified to plate body 112*a* that has a flat surface 3100 surrounding opening 111*a* that is modified from opening 111 to form a mud ring fastening portion. Flat surface 3100 includes box holes 123*a*, 124*a*, 147*a*, 148*a* that are modified from box holes 123, 124, 147, 148, and grooves 171*a*, 172*a*, 196*a*, 198*a* through plate body 112*a* that are modified from holes 171, 172, 196, 198. Referring to FIGS. 31 and 32, plate body 112*a* can receive a cover 3102 that has a mud ring 3104 to connect to an electrical device (not shown), for example, an electrical outlet, that connects to mud ring 3104 by fasteners, for example, screws, that are inserted through holes 3106. Cover 3102 is placed on flat surface 3100 to removably connect cover 3102 to plate body 112*a* by a fastener, for example, a screw, that passes through a groove 3108 through cover 3102 and hole 124*a*. Plate body 112*a* can receive different covers 3102 each having mud ring 3104 having a different shape, for example, a single mud ring or a double mud ring.

Accordingly, single gang cover plate 100 and double gang cover plate 201 are each a universal cover plate that can be snapped-on over a stud 1000 freeing a user's hands for an easier installation. Single gang cover plate 100 and double gang cover plate 201 each is symmetrical at the four sides; a user can use the single gang cover plate 100 for horizontal or vertical applications. Single gang cover plate 100 and double gang cover plate 201 can also be mounted on each side of the stud 1000. The depth of single gang cover plate 100 and double gang cover plate 201 each is fully adjustable from 1½ inch to 1⅜ inch so the wall thickness is not an issue anymore. Single gang cover plate 100 and double gang cover plate 201 can also be used for pre-fab (pre-fabricated) applications, where the universal cover plate of single gang cover plate 100 and double gang cover plate 201 can be snapped-on a brace 200 that is adjustable for a hands free mounting.

It should also be noted that the terms "first", "second", "third", "upper", "lower", and the like may be used herein to modify various elements. These modifiers do not imply a spatial, sequential, or hierarchical order to the modified elements unless specifically stated.

While the present disclosure has been described with reference to one or more exemplary embodiments, it will be understood by those skilled in the art that various changes may be made and equivalents may be substituted for elements thereof without departing from the scope of the present disclosure. In addition, many modifications may be made to adapt a particular situation or material to the teachings of the disclosure without departing from the scope thereof. Therefore, it is intended that the present disclosure not be limited to the particular embodiment(s) disclosed as the best mode contemplated, but that the disclosure will include all embodiments falling within the scope of the appended claims.

| PARTS LIST |
| --- |
| single gang cover plate 100 |
| first flap 102 |
| first cutout 103 |
| second flap 104 |
| second cut out 105 |
| third flap 106 |
| third cutout 107 |
| fourth flap 108 |
| fourth cutout 109 |
| diamond shape hole 110 |
| opening 111 |
| single plate body 112 |
| sleeve 113 |
| screws 113a, 113b |
| first stud hole 114 |
| first brace hole 116 |
| holes 117 |
| gap 118 |
| holes 119a, 119b |
| second brace hole 120 |
| holes 121a, 121b |
| second stud hole 122 |
| first box hole 123 |
| second box hole 124 |
| stud tab 126 |
| members 128, 130 |
| projection 132 |
| hook portion 134 |
| diamond shape hole 136 |
| first stud hole 138 |
| first brace hole 140 |
| gap 142 |
| second brace hole 144 |
| second stud hole 146 |
| first box hole 147 |
| second box hole 148 |
| stud tab 150 |
| members 152, 154 |
| projection 156 |
| hook portion 158 |
| diamond shape hole 160 |
| first stud hole 162 |
| first brace hole 164 |
| gap 166 |
| second brace hole 168 |
| second stud hole 170 |
| box hole 171 |
| box hole 172 |
| stud tab 174 |
| members 176, 178 |
| projection 180 |
| hook portion 182 |
| diamond shape hole 184 |
| first stud hole 186 |
| first brace hole 188 |
| gap 190 |
| second brace hole 192 |
| second stud hole 194 |
| first box hole 196 |
| second box hole 198 |
| brace 200 |
| double gang cover plate 201 |
| inner brace member 202 |
| outer brace member 204 |
| outer end support 206 |
| first outer rail 208 |
| second outer rail 210 |
| holes 211 |
| inner end support 212 |
| first inner rail 214 |
| second inner rail 216 |
| electrical box 300 |
| flange 302 |
| fastener 303 |
| first fastener 304 |
| fastener 305 |
| second fastener 306 |
| third fastener 308 |
| fourth fastener 310 |
| connector holes 900 |
| studs 1000, 1102 |
| stud tab 1001 |
| members 1002, 1004 |
| projection 1006 |
| hook portion 1008 |
| holes 1117 |
| single gang cover plate 1500 |
| single gang cover plate 1600 |
| first fastener 1601 |
| second fastener 1602 |
| third fastener 1604 |
| fourth fastener 1606 |
| double gang cover plate 1700 |
| first side 1701 |
| second side 1702 |
| second electrical box 1740 |
| third electrical box 1742 |
| fasteners 1900, 1902 |
| fasteners 1906, 1908 |
| connector holes 2300 |

-continued

PARTS LIST box flange 2500
depression 2502
cover 2700
mud ring 2702
holes 2704
plate body 112a
flat surface 3100
opening 111a
box holes 123a, 124a, 147a, 148a
grooves 171a, 172a, 196a, 198a
cover 3102
mud ring 3104
holes 3106
groove 3108

What is claimed is:

1. A cover plate that is connectable to an electrical box comprising:
a body configured to mount to a stud, a brace assembly, or in a gang application on opposite sides of the stud, wherein the body is symmetrical on four sides, wherein the body forms a first flap, a second flap, a third flap and a fourth flap, and wherein each of the first flap, the second flap, the third flap and the fourth flap has a stud fab and a projection.

2. The cover plate of claim 1, wherein the body snaps on over the stud allowing for insertion of one or more fasteners.

3. The cover plate of claim 1, wherein the body snaps on the brace assembly allowing for insertion of one or more fasteners.

4. The cover plate of claim 3, wherein the body is selectively slidable on the brace assembly.

5. The cover plate of claim 1, wherein the body is connectable to the stud or the brace assembly in a horizontal orientation or a vertical orientation.

6. The cover plate of claim 1, wherein the stud tab and the projection of one of the first flap, the second flap, the third flap and the fourth flap extend on opposite sides of the stud to connect the cover plate to the stud, wherein the stud tab of the one of the first flap, the second flap, the third flap and the fourth flap extends on a first side of the stud and the projection of the one of the first flap, the second flap, the third flap and the fourth flap extends on a second side of the stud that is opposite the first side of the stud.

7. The cover plate of claim 6, wherein the projection of another of one of the first flap, the second flap, the third flap and the fourth flap extends on the second side of the stud.

8. The cover plate of claim 6, wherein the cover plate is a first cover plate and further comprising a second cover plate, wherein the body of the first cover plate has a cutout to receive the stud tab of the second cover plate therein and the body of the second cover plate has a cutout to receive the stud tab of the first cover plate therein.

9. The cover plate of claim 1, wherein each of the first flap, the second flap, the third flap and the fourth flap has an opening to receive a fastener to connect the cover plate to the stud and an opening to connect the cover plate to the brace assembly.

10. The cover plate of claim 1, wherein the body has an opening that receives a sleeve that is adjustable in the opening.

11. The cover plate of claim 1, wherein the electrical box is a plurality of electrical boxes each having a different size, and wherein the body is connectable to each of the plurality of electrical boxes.

12. The cover plate of claim 11, wherein the body has a plurality of fastener holes and/or grooves through the body to connect to electrical boxes of various sizes.

13. The cover plate that is connectable to an electrical box comprising:
a body configured to mount to a stud, a brace assembly, or in a gang application on opposite sides of the stud, wherein the body is symmetrical on four sides, wherein the body forms a first flap, a second flap, a third flap and a fourth flap, and wherein each of the first flap, the second flap, the third flap and the fourth flap has two openings to receive fasteners to connect the cover plate to the stud and two openings to connect the cover plate to the brace assembly.

14. A cover plate that is connectable to an electrical box comprising:
a body configured to mount to a stud, a brace assembly, or in a gang application on opposite sides of the stud, wherein the body is symmetrical on four sides, wherein the body forms a first flap, a second flap, a third flap and a fourth flap, and wherein the first flap, the second flap, the third flap and the fourth flap allow the body to be connected on the stud in four different orientations on a first side of the stud and four different orientations on a second side of the stud that is opposite the first side of the stud.

15. A cover plate that is connectable to an electrical box comprising:
a body configured to mount to a stud, a brace assembly, or in a gang application on opposite sides of the stud, wherein the body is symmetrical on four sides, wherein the body forms a first flap, a second flap, a third flap and a fourth flap, and wherein the first flap, the second flap, the third flap and the fourth flap allow the body to be connected on the brace assembly in four different orientations.

* * * * *